(12) United States Patent
Nakashima

(10) Patent No.: US 11,863,166 B2
(45) Date of Patent: Jan. 2, 2024

(54) POWER SEMICONDUCTOR MODULE AND POWER CONVERTER

(71) Applicant: Mitsubishi Electric Corporation, Tokyo (JP)

(72) Inventor: Junichi Nakashima, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 119 days.

(21) Appl. No.: 17/616,692

(22) PCT Filed: Aug. 27, 2019

(86) PCT No.: PCT/JP2019/033555
§ 371 (c)(1),
(2) Date: Dec. 6, 2021

(87) PCT Pub. No.: WO2021/038724
PCT Pub. Date: Mar. 4, 2021

(65) Prior Publication Data
US 2022/0311431 A1    Sep. 29, 2022

(51) Int. Cl.
*H03K 17/16* (2006.01)
*H01L 23/538* (2006.01)
(Continued)

(52) U.S. Cl.
CPC ......... *H03K 17/16* (2013.01); *H01L 23/5386* (2013.01); *H01L 25/16* (2013.01); *H01L 25/18* (2013.01); *H02M 7/537* (2013.01); *H03K 5/1252* (2013.01); *H01L 24/32* (2013.01); *H01L 24/48* (2013.01); *H01L 24/49* (2013.01); *H01L 24/73* (2013.01); *H01L 2224/32225* (2013.01); *H01L 2224/48225* (2013.01); *H01L 2224/49111* (2013.01); *H01L 2224/49112* (2013.01); *H01L 2224/49175* (2013.01);
(Continued)

(58) Field of Classification Search
CPC ....................................................... H03K 17/16
USPC ................................................................ 327/109
See application file for complete search history.

(56) References Cited

U.S. PATENT DOCUMENTS 11,063,025 B2 * 7/2021 Nakashima ............. H01L 24/48
2004/0041201 A1    3/2004 Sugiyama et al.

FOREIGN PATENT DOCUMENTS

JP    2000-243905 A    9/2000
JP    2002-76236 A    3/2002
(Continued)

OTHER PUBLICATIONS

International Search Report and Written Opinion dated Nov. 19, 2019, received for PCT Application PCT/JP2019/033555, Filed on Aug. 27, 2019, 7 pages including English Translation.

*Primary Examiner* — Tomi Skibinski
(74) *Attorney, Agent, or Firm* — XSENSUS LLP

(57) ABSTRACT

A power semiconductor module includes a semiconductor switching element, a gate control pattern to which a gate electrode of the semiconductor switching element is connected, a source control pattern to which a source electrode of the semiconductor switching element is connected, a capacitor to form a low-pass filter, a capacitor arrangement pattern to which one end of the capacitor is connected, and a wire. The other end of the capacitor is connected to the source control pattern. The wire electrically connects the capacitor arrangement pattern and the gate control pattern.

19 Claims, 17 Drawing Sheets

(51) Int. Cl.
  *H01L 25/16* (2023.01)
  *H01L 25/18* (2023.01)
  *H02M 7/537* (2006.01)
  *H03K 5/1252* (2006.01)
  *H01L 23/00* (2006.01)

(52) U.S. Cl.
  CPC ............... *H01L 2224/73265* (2013.01); *H01L 2924/1033* (2013.01); *H01L 2924/10254* (2013.01); *H01L 2924/10272* (2013.01); *H01L 2924/13055* (2013.01); *H01L 2924/13091* (2013.01)

(56) References Cited

FOREIGN PATENT DOCUMENTS

| | | |
|---|---|---|
| JP | 2003-125574 A | 4/2003 |
| JP | 2003-188336 A | 7/2003 |
| JP | 2004-14547 A | 1/2004 |

\* cited by examiner

POWER SEMICONDUCTOR MODULE AND POWER CONVERTER

CROSS-REFERENCE TO RELATED APPLICATIONS

The present application is based on PCT filing PCT/JP2019/033555, filed Aug. 27, 2019, the entire contents of which are incorporated herein by reference. This application is also related to U.S. Patent Application Serial Number; Ser. No. 16/632,029, filed Jan. 17, 2020 (now U.S. Pat. No. 11,063,025).

TECHNICAL FIELD

The present invention relates to a power semiconductor module and a power converter.

BACKGROUND ART

In a power semiconductor module used in a power converter such as an inverter or a converter, during the switching operation of semiconductor switching elements, the parasitic capacitance of the semiconductor switching elements and the parasitic inductance between the semiconductor switching elements may cause gate oscillation or noise to occur.

It is known that the gate oscillation may be suppressed by a low pass filter (hereinafter will be simply referred to as a "filter") which is formed by connecting a capacitor between a gate and a source of a semiconductor switching element (see for example PTL 1 and PTL 2).

CITATION LIST

Patent Literature

PTL 1: Japanese Patent Laying-Open No. 2000-243905
PTL 2: Japanese Patent Laying-Open No. 2003-125574

SUMMARY OF INVENTION

Technical Problem

Although the gate oscillation may be suppressed by forming a filter as described above, since the filter forming element (i.e., the capacitor as described above) is arranged in parallel with the input capacitance of the semiconductor switching element, the input capacitance of the semiconductor switching element increases, which disadvantageously increases the charging/discharging time of the input capacitance during the switching operation of the semiconductor switching element and decreases the switching speed thereof.

Depending on a product type, it is possible to change the performance of a filter to be formed or prioritize the switching speed without forming a filter. However, if the manufacturing process is made different for each module depending on the performance of a filter and whether or not a filter is necessary, the manufacturing process becomes complicated, which increases the manufacturing cost.

The present disclosure has been made in order to solve the aforementioned problems, and an object thereof is to provide a power semiconductor module capable of easily adjusting a filter provided for suppressing gate oscillation and capable of easily connecting the filter to or disconnecting the filter from the power semiconductor module, and a power converter including the power semiconductor module.

Solution to Problem

A power semiconductor module of the present disclosure includes a first semiconductor switching element, a gate control pattern to which a gate electrode of the first semiconductor switching element is connected, a source control pattern to which a source electrode of the first semiconductor switching element is connected, a filter forming element to form a low-pass filter, a first filter arrangement pattern to which one end of the filter forming element is connected, and a first wire. The other end of the filter forming element is connected to one pattern of the gate control pattern and the source control pattern. The first wire electrically connects the first filter arrangement pattern to the other pattern of the gate control pattern and the source control pattern.

Advantageous Effects of Invention

According to the power semiconductor module and the power converter including the power semiconductor module, the gate oscillation generated by the first semiconductor switching element may be suppressed by using a low pass filter formed from the filter forming element. According to the power semiconductor module, it is possible to easily adjust the filter simply by adjusting the length and/or the diameter of the first wire. When the switching speed is prioritized without forming a filter, the filter may be disconnected from a circuit simply by not bonding the first wire.

DESCRIPTION OF EMBODIMENTS

Figure 1:
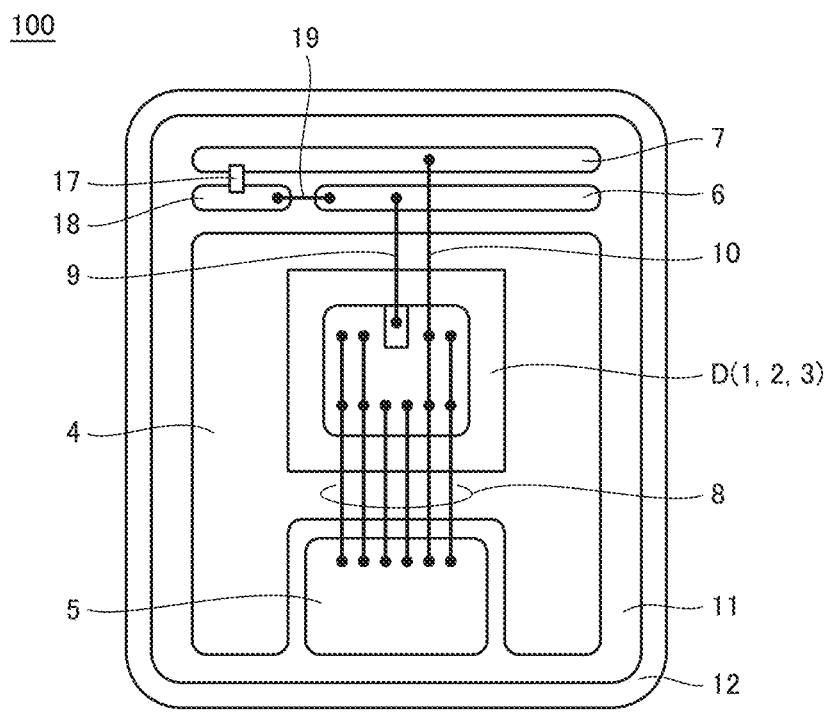
FIG. 1 is a plan view schematically illustrating the configuration of a power semiconductor module according to a first embodiment.

Hereinafter, embodiments of the present disclosure will be described in detail with reference to the drawings. In the following description, a plurality of embodiments will be described; however, it is initially expected at the time of filing the present application that the configurations described in each embodiment may be appropriately combined as long as they are not contradictory to each other. It should be noted that the same or corresponding portions in the drawings are denoted by the same reference numerals, and the description thereof will not be repeated.

First Embodiment

Figure 2:
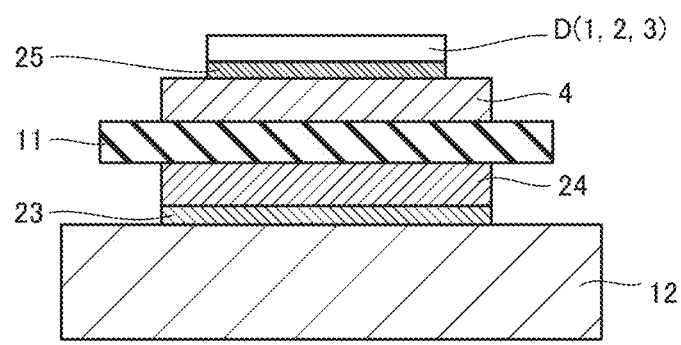
FIG. 2 is a cross-sectional view schematically illustrating a part of the power semiconductor module.
Figure 3:
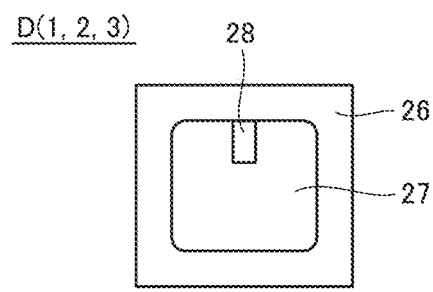
FIG. 3 is a plan view schematically illustrating the configuration of a semiconductor element.
Figure 4:
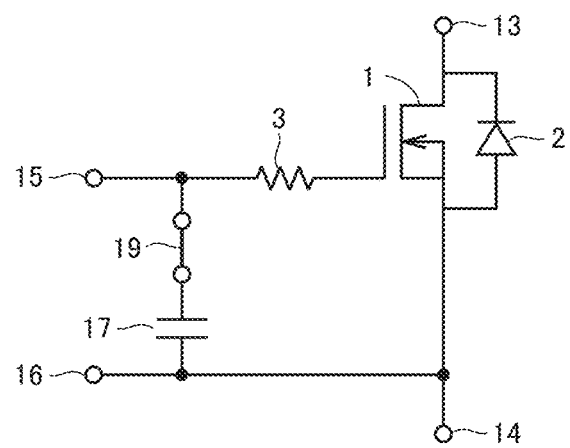
FIG. 4 is an equivalent circuit diagram illustrating an electrical configuration of the power semiconductor module illustrated in FIG. 1.

The configuration of a power semiconductor module according to the first embodiment will be described with reference to FIGS. 1 to 4. FIG. 1 is a plan view schematically illustrating the configuration of a power semiconductor module according to a first embodiment. FIG. 2 is a cross-sectional view schematically illustrating a part of the power semiconductor module illustrated in FIG. 1. FIG. 3 is a plan view schematically illustrating the configuration of a semiconductor element illustrated in FIG. 1. FIG. 4 is an equivalent circuit diagram illustrating an electrical configuration of the power semiconductor module illustrated in FIG. 1.

With reference to FIGS. 1 to 3, the power semiconductor module 100 includes a semiconductor element D, a drain pattern 4, a source pattern 5, a gate control pattern 6, a source control pattern 7, a source wire 8, a gate wire 9, a source control wire 10, an insulating substrate 11, and a base plate 12.

The base plate 12 is a heat dissipation plate which is made of metal and is configured to dissipate heat inside the module to the outside. The insulating substrate 11 is made of ceramic and is disposed on the base plate 12. The insulating substrate 11 is not necessarily made of ceramic, it may be made of a metal substrate provided with a resin insulating layer.

As illustrated in FIG. 2, a back surface pattern 24 is bonded to the back surface (the lower surface in the drawing) of the insulating substrate 11 by brazing or the like, and the insulating substrate 11 is bonded to the upper surface of the base plate 12 via solder 23. Various wiring patterns (such as the drain Pattern 4, the source pattern 5, the gate control pattern 6, and the source control pattern 7) are bonded to the front surface (the upper surface in the drawing) of the insulating substrate 11 by brazing or the like. The semiconductor element D is bonded to the drain pattern 4 via solder 25. Other bonding materials may be used instead of the solders 23 and 25.

With reference to FIG. 4, the semiconductor element D includes a semiconductor switching element 1, a diode 2, and a gate resistor 3. The semiconductor switching element 1 is a MOSFET (Metal Oxide Semiconductor Field Effect Transistor). The diode 2 is electrically connected in anti-parallel to the semiconductor switching element 1. The diode 2 is a body diode (it may be referred to as a parasitic diode or an internal diode) formed inside the semiconductor switching element 1. The gate resistor 3 is connected to a gate electrode of the semiconductor switching element 1. The gate resistor 3 is an internal gate resistor formed inside the semiconductor switching element 1.

In the present embodiment, although the semiconductor switching element 1, the diode 2, and the gate resistor 3 are integrally formed as the semiconductor element D as described in the above, the diode 2 may be an external diode outside the semiconductor switching element 1, and the gate resistor 3 may be an external gate resistor. Although the semiconductor switching element 1 is a MOSFET as described in the above, it may be a bipolar transistor such as an IGBT (Insulated Gate Bipolar Transistor). In this case, the semiconductor switching element 1, the diode 2 and the gate resistor 3 may be constituted by separate chips.

The semiconductor element D is made of a wide bandgap semiconductor. The wide bandgap semiconductor may be, for example, silicon carbide (SiC), gallium nitride (GaN), or diamond (C). Since the wide bandgap semiconductor is superior in voltage resistance as compared with a conventional silicon semiconductor, if the semiconductor element D is made of a wide bandgap semiconductor, it is possible for the semiconductor element D to resist the same voltage with a half thickness or less as compared with a conventional silicon semiconductor. As a result, it is possible to reduce the size of a chip constituting the semiconductor element D. Furthermore, since the thickness is made smaller as compared with a conventional silicon semiconductor, the resistance is reduced accordingly, which makes it possible to reduce the loss.

A drain pad (not shown) of the semiconductor element D is bonded to the drain pattern 4 via the solder 25 (FIG. 2), and a source pad 27 (FIG. 3) of the semiconductor element D is connected to one end of the source wire 8, and the other end of the source wire 8 is connected to the source pattern 5. One end of the source control wire 10 is connected to the source pad 27, and the other end of the source control wire 10 is connected to the source control pattern 7. One end of the gate wire 9 is connected to a gate pad 28 (FIG. 3) of the semiconductor element D, and the other end of the gate wire 9 is connected to the gate control pattern 6.

The drain pattern 4 and the source pattern 5 are connected to the drain terminal 13 and the source terminal 14 (FIG. 4), respectively, and the gate control pattern 6 and the source control pattern 7 are connected to a gate terminal 15 and a source control terminal 16 (FIG. 4), respectively. The drain terminal 13, the source terminal 14, the gate terminal 15, and the source control terminal 16 (which are not shown in FIG. 1) are exposed to the outside of the power semiconductor module 100.

The power semiconductor module 100 according to the first embodiment further includes a capacitor 17, a capacitor arrangement pattern 18, and a wire 19. Hereinafter, the reason why the capacitor 17, the capacitor arrangement pattern 18, and the wire 19 are provided will be described.

In the power semiconductor module having the configuration mentioned above, undesired gate oscillation or noise may occur in the gate voltage of the semiconductor switching element during the switching operation of the semiconductor switching element.

For example, in double-pulse switching by using an L load (inductance), a large amplitude oscillation may occur in the gate-source voltage of a semiconductor switching element when the semiconductor switching element is turned on or turned off. It is considered that such oscillation is caused by the parasitic capacitance of the semiconductor switching element and the parasitic inductance of the wiring connected to the semiconductor switching element, and is called gate oscillation. The gate oscillation may damage the oxide film of the semiconductor switching element, resulting in degradation or destruction to the semiconductor switching element as well as radiation noise to the outside of the module and propagation noise to an external circuit. In addition, such a phenomenon may occur when a plurality of semiconductor switching elements are connected in parallel to each other.

As an approach of suppressing the gate oscillation, it is known to add a gate resistor, or dispose a capacitor between the gate and the source, or provide a ferrite core in the gate wiring. The present disclosure focuses on the approach of disposing a capacitor between the gate and the source.

When a capacitor is disposed between the gate and the source, a low pass filter is formed in the portion where the capacitor is disposed, and whereby, the gate oscillation is suppressed. On the other hand, when such a capacitor is provided, the input capacitance of the semiconductor switching element increases apparently, which decreases the switching speed of the semiconductor switching element. Therefore, depending on a product type, it is possible to prioritize the switching speed without forming a filter.

Further, the performance of the formed filter is not determined only by the capacitance of the capacitor, it may be affected by the parasitic inductance of peripheral patterns and the characteristics of the semiconductor switching element. Therefore, when a filter is to be formed, it is required to design the filter while paying attention to the parasitic inductance of the peripheral patterns or the like. However, if the manufacturing process is made different for each module depending on the performance of a filter and whether or not a filter is necessary, the manufacturing process becomes complicated, which increases the manufacturing cost.

Therefore, the power semiconductor module 100 according to the first embodiment includes a capacitor 17, a capacitor arrangement pattern 18, and a wire 19, which makes it possible to easily adjust the filter formed from the capacitor 17 and easily connect the filter to or disconnect the filter from the power semiconductor module.

Specifically, the capacitor arrangement pattern 18 is arranged close to both the gate control pattern 6 and the source control pattern 7. In the present embodiment, as illustrated in FIG. 1, the gate control pattern 6 and the source control pattern 7 are arranged parallel to each other on a lateral side of the drain pattern 4 (the upper side in FIG. 1). The length of the gate control pattern 6 is shorter than the length of the source control pattern 7, and the capacitor arrangement pattern 18 is arranged in a space formed by the difference in length.

One end of the capacitor 17 is bonded to the capacitor arrangement pattern 18 by solder or the like, and the other end of the capacitor 17 is bonded to the source control pattern 7 by solder or the like. The capacitor arrangement pattern 18 and the gate control pattern 6 are connected to each other by the wire 19.

With such a configuration, the capacitor 17 is arranged between the gate and the source of the semiconductor switching element 1, and an LC filter (low-pass filter) is formed by the inductance of each pattern and the wire 19 and the capacitance of the capacitor 17. The performance of the LC filter may be adjusted by changing the wiring inductance through appropriate modification of the length and/or the diameter of the wire 19. In other words, it is possible to easily adjust the performance of the filter formed from the capacitor 17 simply by changing (adjusting) the length and/or the diameter of the wire 19.

When a filter is not required so as to prioritize the switching speed of the semiconductor switching element 1, the wire 19 may not be bonded. Thus, the filter (the capacitor 17) may be easily disconnected from the circuit.

In the present embodiment, a circuit composed of a passive element or an active element or a combination thereof which forms a filter together with the inductance of the wire 19 and each pattern may be used instead of the capacitor 17 or together with the capacitor 17. For example, a diode having a capacitance component, a MOSFET with a variable capacitance and resistance under external control, or the like may be used instead of the capacitor 17.

First Modification of First Embodiment

In the first embodiment, the capacitor arrangement pattern 18 is provided on a lateral side of the gate control pattern 6 which is arranged in parallel to the source control pattern 7, and the capacitor arrangement pattern 18 is connected to the gate control pattern 6 by the wire 19, but the capacitor arrangement pattern may be provided on a lateral side of the source control pattern 7.

Figure 5:
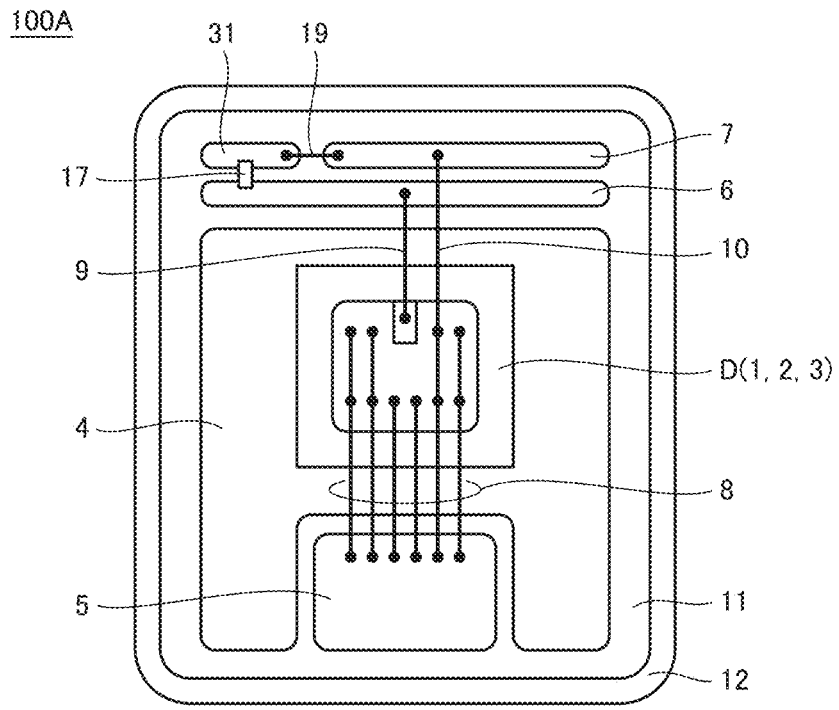
FIG. 5 is a plan view schematically illustrating the configuration of a power semiconductor module according to a first modification of the first embodiment.
Figure 6:
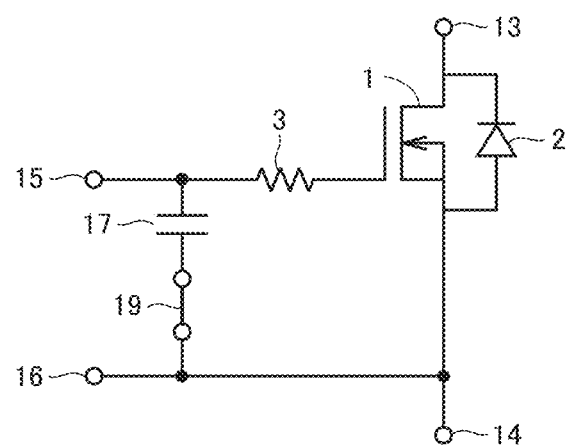
FIG. 6 is an equivalent circuit diagram illustrating an electrical configuration of the power semiconductor module illustrated in FIG. 5.

FIG. 5 is a plan view schematically illustrating the configuration of a power semiconductor module according to a first modification of the first embodiment, and FIG. 6 is an equivalent circuit diagram illustrating an electrical configuration of the power semiconductor module illustrated in FIG. 5.

With reference to FIGS. 5 and 6, the power semiconductor module 100A includes a capacitor arrangement pattern 31 instead of the capacitor arrangement pattern 18 in the power semiconductor module 100 according to the first embodiment illustrated in FIG. 1.

The capacitor arrangement pattern 31 is arranged close to both the gate control pattern 6 and the source control pattern 7. In the present modification, the length of the source control pattern 7 is shorter than the length of the gate control pattern 6, and the capacitor arrangement pattern 31 is arranged in a space formed by the difference in length.

One end of the capacitor 17 is bonded to the capacitor arrangement pattern 31 by solder or the like, and the other end of the capacitor 17 is bonded to the source control pattern 7 by solder or the like. The capacitor arrangement pattern 31 and the gate control pattern 6 are connected to each other by the wire 19.

With such a configuration, it is possible to easily adjust the performance of the filter formed from the capacitor 17 simply by changing (adjusting) the length and/or the diameter of the wire 19 as in the first embodiment. Further, when a filter is not required so as to prioritize the switching speed, the filter (the capacitor 17) may be easily disconnected from the circuit simply by not bonding the wire 19.

Second Modification of First Embodiment

The capacitor arrangement pattern may be provided on both a lateral side of the gate control pattern 6 and a lateral side of the source control pattern 7.

Figure 7:
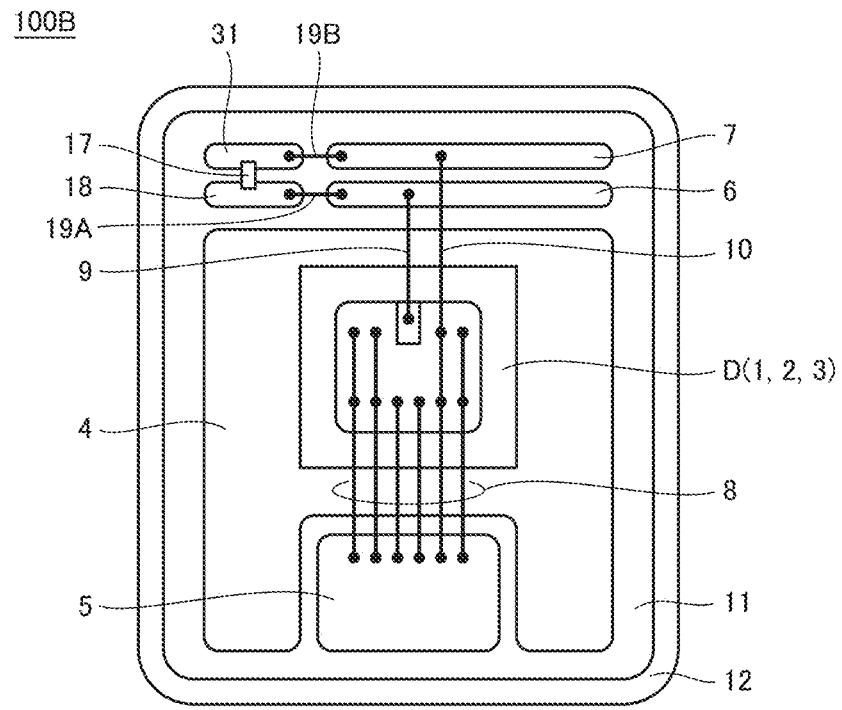
FIG. 7 is a plan view schematically illustrating the configuration of a power semiconductor module according to a second modification of the first embodiment.
Figure 8:
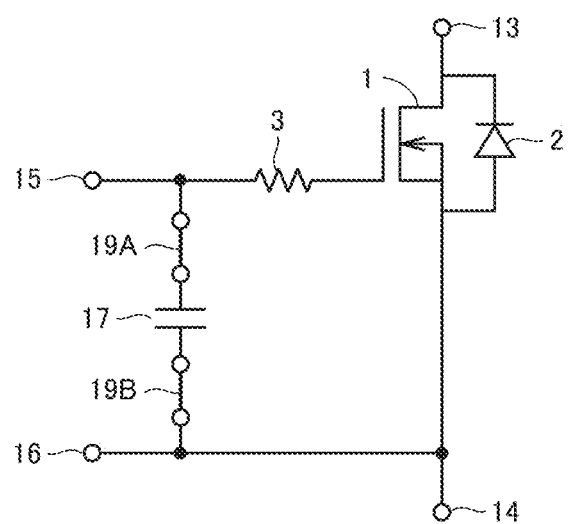
FIG. 8 is an equivalent circuit diagram illustrating an electrical configuration of the power semiconductor module illustrated in FIG. 7.

FIG. 7 is a plan view schematically illustrating the configuration of a power semiconductor module according to a second modification of the first embodiment, and FIG. 8 is an equivalent circuit diagram illustrating an electrical configuration of the power semiconductor module illustrated in FIG. 7.

With reference to FIGS. 7 and 8, the power semiconductor module 100B further includes a capacitor arrangement pattern 31 and wires 19A and 19B instead of the wire 19 in the power semiconductor module 100 according to the first embodiment illustrated in FIG. 1.

The capacitor arrangement pattern 31 is the same as that described in the first modification and illustrated in FIG. 5. One end of the capacitor 17 is bonded to the capacitor arrangement pattern 18 by solder or the like, and the other end of the capacitor 17 is bonded to the capacitor arrangement pattern 31. The capacitor arrangement pattern 18 and the gate control pattern 6 are connected to each other by the wire 19A, and the capacitor arrangement pattern 31 and the source control pattern 7 are connected to each other by the wire 19B.

With such a configuration, it is possible to easily adjust the performance of the filter formed from the capacitor 17 simply by changing (adjusting) the length and/or the diameter of the wires 19A and 19B as in the first embodiment and the first modification. When a filter is not required so as to prioritize the switching speed, the filter (the capacitor 17) may be easily disconnected from the circuit simply by not bonding at least one of the wires 19A and 19B.

Further, according to the second modification, since two wires 19A and 19B are used, it is possible to increase (enlarge) the adjustable range of the inductance of the filter formed from the capacitor 17.

Third Modification of First Embodiment

Each configuration including the capacitor 17, the capacitor arrangement pattern 18 (31) and the wire 19 (19A, 19B) as mentioned above is suitable for a power semiconductor module composed of a plurality of semiconductor elements that operate in parallel. In other words, in order to implement a power semiconductor module that performs switching operation at a large current, a plurality of semiconductor elements are mounted in the module and are operated in parallel. However, in this case, the gate control pattern or the like may serve as an amplification path between adjacent semiconductor elements to amplify a high-frequency portion of a gate voltage, which may cause gate oscillation to occur.

Therefore, in the third modification, the capacitor 17, the capacitor arrangement pattern 18 and the wire 19 illustrated in FIG. 1 are provided in a power semiconductor module composed of a plurality of semiconductor elements that operate in parallel.

Figure 9:
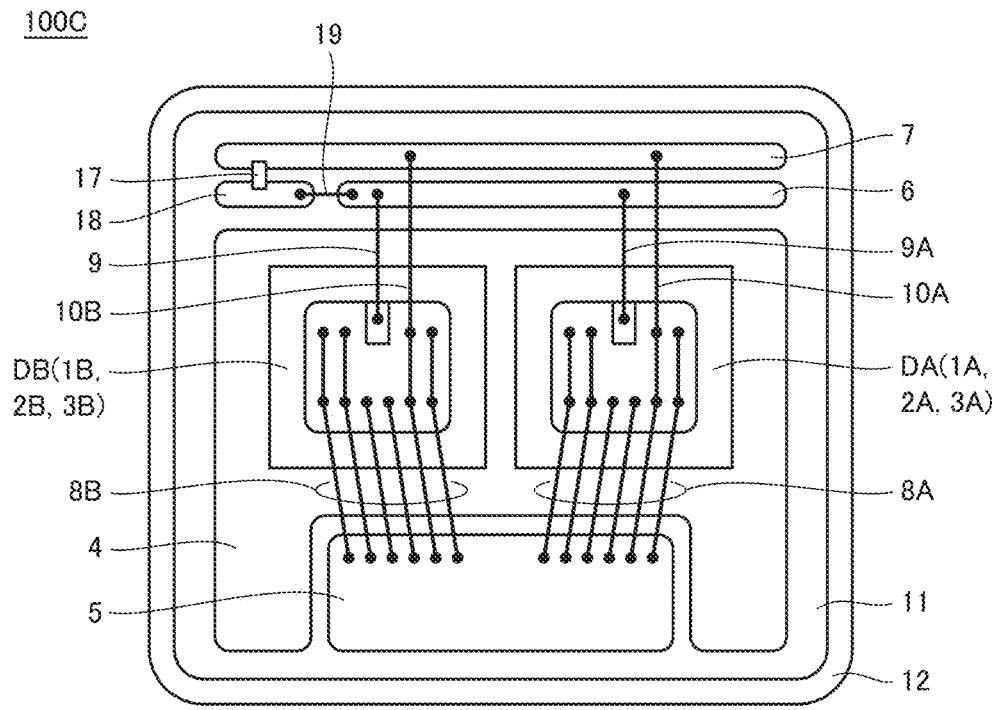
FIG. 9 is a plan view schematically illustrating the configuration of a power semiconductor module according to a third modification of the first embodiment.
Figure 10:
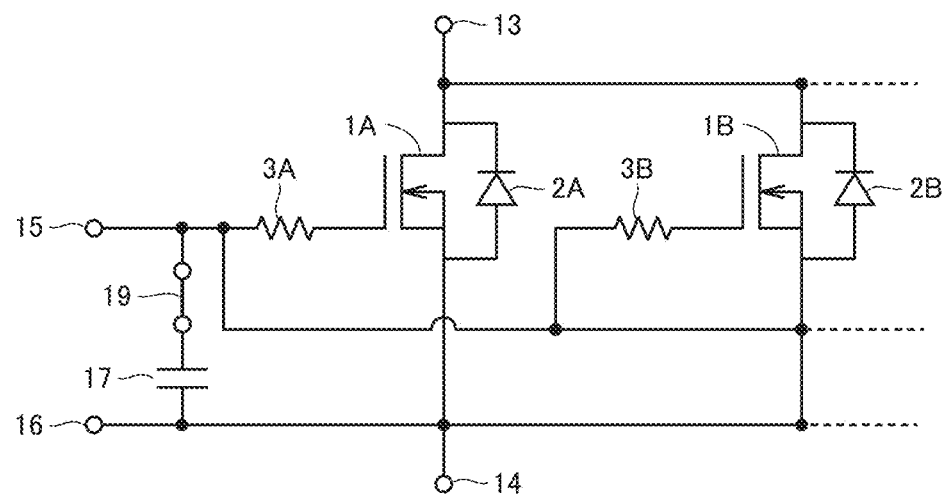
FIG. 10 is an equivalent circuit diagram illustrating an electrical configuration of the power semiconductor module illustrated in FIG. 9.

FIG. 9 is a plan view schematically illustrating the configuration of a power semiconductor module according to a third modification of the first embodiment, and FIG. 10 is an equivalent circuit diagram illustrating an electrical configuration of the power semiconductor module illustrated in FIG. 9.

With reference to FIGS. 9 and 10, the power semiconductor module 100C includes a plurality of semiconductor elements DA and DB instead of the semiconductor element D in the power semiconductor module 100 illustrated in FIG. 1. The semiconductor element DB and the semiconductor element DA are connected in parallel to each other. In the present modification, it is described that the power semiconductor module 100C includes two semiconductor elements DA and DB, but the number of the semiconductor elements connected in parallel may be three or more.

The semiconductor element DA includes a semiconductor switching element 1A, a diode 2A, and a gate resistor 3A. The semiconductor element DB includes a semiconductor switching element 1B, a diode 2B, and a gate resistor 3B. The configuration of each of the semiconductor elements DA and DB is the same as that of the semiconductor element D described above.

One end of a source wire 8A is connected to the source pad of the semiconductor element DA, and the other end of the source wire 8A is connected to the source pattern 5. Further, one end of a source control wire 10A is connected to the source pad of the semiconductor element DA, and the other end of the source control wire 10A is connected to the source control pattern 7. One end of a gate wire 9A is connected to the gate pad of the semiconductor element DA, and the other end of the gate wire 9A is connected to the gate control pattern 6.

One end of a source wire 8B is connected to the source pad of the semiconductor element DB, and the other end of the source wire 8B is connected to the source pattern 5. Further, one end of a source control wire 10B is connected to the source pad of the semiconductor element DB, and the other end of the source control wire 10B is connected to the source control pattern 7. One end of a gate wire 9B is connected to the gate pad of the semiconductor element DB, and the other end of the gate wire 9B is connected to the gate control pattern 6. With this configuration, the semiconductor elements DA and DB are allowed to perform parallel operations.

The capacitor 17, the capacitor arrangement pattern 18, and the wire 19 are the same as those provided in the power semiconductor module 100 illustrated in FIG. 1.

According to the third modification, in the power semiconductor module 100C composed of a plurality of semiconductor elements that operate in parallel, it is possible to effectively suppress the gate oscillation in the semiconductor elements DA and DB by forming a filter with the capacitor 17.

Further, it is possible to easily adjust the performance of the filter formed from the capacitor 17 simply by changing (adjusting) the length and/or the diameter of the wire 19. When a filter is not required so as to prioritize the switching speed, the filter (the capacitor 17) may be easily disconnected from the circuit simply by not bonding the wire 19.

In the modification described above, the semiconductor elements DA and DB are provided instead of the semiconductor element D in the power semiconductor module 100 according to the first embodiment, but the semiconductor elements DA and DB may be provided instead of the semiconductor element D in the power semiconductor module 100A according to the first modification or the power semiconductor module 100B according to the second modification.

Second Embodiment

It is important to monitor an internal temperature of a power semiconductor module. In particular, in a power semiconductor module which operates at a large current, the internal temperature of a semiconductor element and/or a peripheral component may exceed an allowable temperature, resulting in deterioration or failure of the semiconductor element and/or the peripheral component.

The internal temperature of the power semiconductor module is generally monitored in such manner that the thermal resistance of the power semiconductor module is determined in advance, and the internal temperature of the module is estimated from the input power and the base temperature of the module. However, due to the degree of warp of the base plate, the variation in the thickness of grease between the cooler and the module or the like, the internal temperature may not be accurately estimated. In addition, if the thermal resistance determined in advance is different from the actual thermal resistance of the module, the internal temperature may not be accurately estimated.

In order to increase the accuracy of estimating the internal temperature, a thermistor is generally mounted inside the power semiconductor module to detect the internal temperature. The internal temperature of the module may be detected by using a detection circuit to detect the resistance value of the thermistor which changes in response to the internal temperature.

It is empirically known that the gate oscillation described in the first embodiment tends to occur in a semiconductor element at a high temperature. Thus, in the second embodiment, an NTC (Negative Temperature Coefficient) thermistor is provided in the power semiconductor module. The NTC thermistor is connected in series to a capacitor 17 which is provided for the purpose of suppressing gate oscillation.

Figure 11:
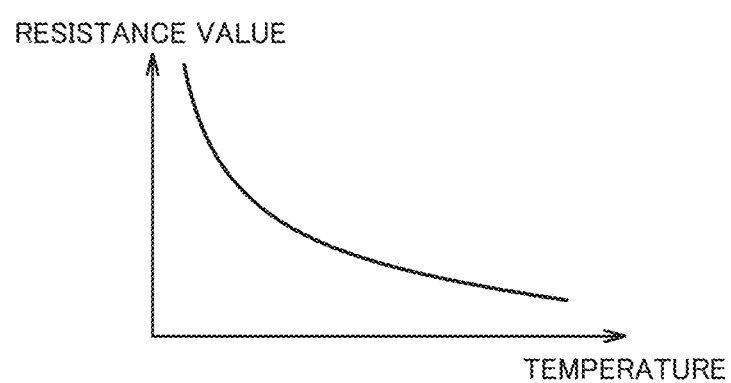
FIG. 11 is a graph illustrating the relationship between a resistance value and a temperature of an NTC thermistor.

As illustrated in FIG. 11, the NTC thermistor has a large resistance value at a low temperature and a small resistance value at a high temperature. Therefore, by connecting the NTC thermistor in series to the capacitor 17, it is possible to prevent the capacitor 17 from functioning at a low temperature and allow the capacitor 17 to function at a high temperature so as to suppress the gate oscillation.

The internal temperature of the power semiconductor module also affects the switching speed of the semiconductor element. When the internal temperature of a MOSFET increases, the turn-on speed thereof increases due to a decrease in a gate threshold voltage Vth, which may cause the current waveform to oscillate. In addition, it is not preferable that the behavior of the semiconductor module changes in response to the internal temperature, and it is desirable that the switching speed of the semiconductor element is not affected by the internal temperature. Therefore, as described above, by connecting an NTC thermistor in series to the capacitor 17, it is possible to allow the capacitor 17 to function at a high temperature so as to prevent the switching speed from increasing.

Figure 12:
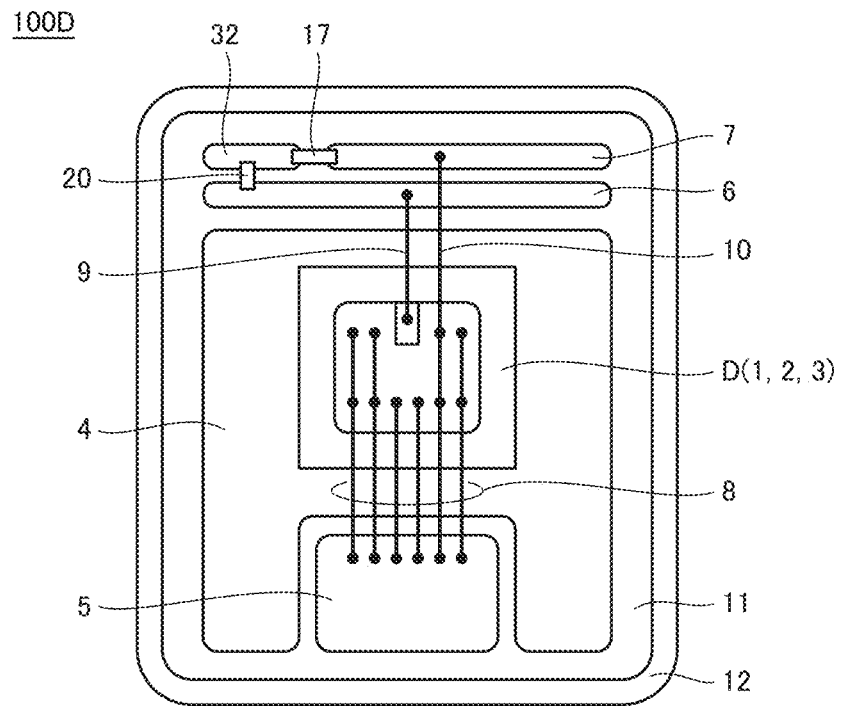
FIG. 12 is a plan view schematically illustrating the configuration of a power semiconductor module according to a second embodiment.
Figure 13:
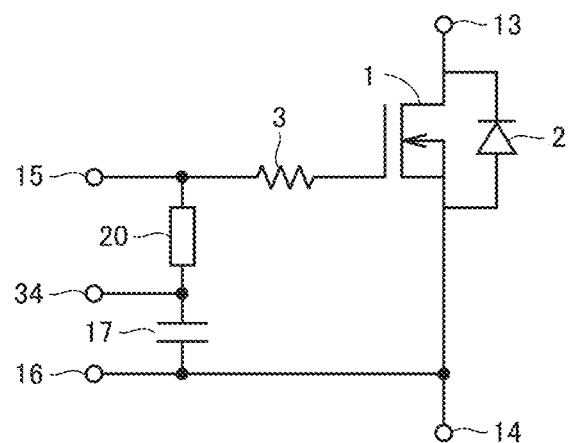
FIG. 13 is an equivalent circuit diagram illustrating an electrical configuration of the power semiconductor module illustrated in FIG. 12.

FIG. 12 is a plan view schematically illustrating the configuration of a power semiconductor module according to a second embodiment, and FIG. 13 is an equivalent circuit diagram illustrating an electrical configuration of the power semiconductor module illustrated in FIG. 12.

With reference to FIGS. 12 and 13, the power semiconductor module 100D includes a semiconductor element D, a drain pattern 4, a source pattern 5, a gate control pattern 6, a source control pattern 7, a source wire 8, a gate wire 9, a source control wire 10, an insulating substrate 11, and a base plate 12. The power semiconductor module 100D further includes a capacitor 17, a thermistor 20, and an arrangement pattern 32 for arranging the capacitor 17 and the thermistor 20.

The thermistor 20 is an NTC thermistor. The arrangement pattern 32 is arranged close to both the gate control pattern 6 and the source control pattern 7. In the present embodiment, the length of the source control pattern 7 is shorter than the length of the gate control pattern 6, and the arrangement pattern 32 is arranged in a space formed by the difference in length.

One end of the thermistor 20 and one end of the capacitor 17 are bonded to the arrangement pattern 32 by solder or the like, the other end of the thermistor 20 is bonded to the gate control pattern 6, and the other end of the capacitor 17 is bonded to the source control pattern 7.

The other components except the capacitor 17, the thermistor 20 and the arrangement pattern 32 are the same as those described in the first embodiment.

With the configuration mentioned above, the capacitor 17 and the thermistor 20 are arranged in series between the gate and the source of the semiconductor switching element 1. Thereby, an LC filter is formed. The LC filter prevents the capacitor 17 from functioning at a low temperature and allows the capacitor 17 to function at a high temperature, which makes it possible to effectively suppress the gate oscillation.

When the temperature is high, the capacitor 17 functions, and thereby the input capacitance of the semiconductor switching element 1 increases. Accordingly, it is possible to prevent the switching speed from increasing at a high temperature, which makes it possible to prevent the behavior of the power semiconductor module 100D from changing in accordance with the internal temperature.

In the present embodiment, a circuit composed of a passive element or an active element or a combination thereof which forms a filter may be used instead of the capacitor 17 or together with the capacitor 17.

First Modification of Second Embodiment

In the second embodiment, it is described that the arrangement pattern 32 is provided on a lateral side of the source control pattern 7 which is arranged in parallel to the gate control pattern 6, but the arrangement pattern may be provided on a lateral side of the gate control pattern 6.

Figure 14:
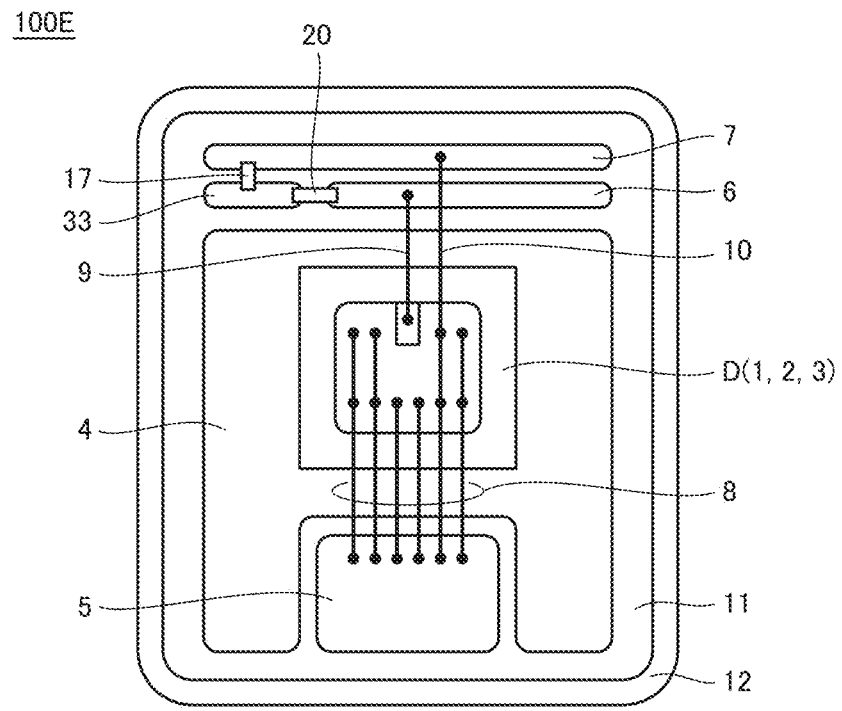
FIG. 14 is a plan view schematically illustrating the configuration of a power semiconductor module according to a first modification of the second embodiment.

FIG. 14 is a plan view schematically illustrating the configuration of a power semiconductor module according to a first modification of the second embodiment.

With reference to FIG. 14, the power semiconductor module 100E includes an arrangement pattern 33 instead of the arrangement pattern 32 in the power semiconductor module 100D illustrated in FIG. 12.

The arrangement pattern 33 is arranged close to both the gate control pattern 6 and the source control pattern 7. In the present modification, the length of the gate control pattern 6 is shorter than the length of the source control pattern 7, and the arrangement pattern 33 is arranged in a space formed by the difference in length.

One end of the thermistor 20 and one end of the capacitor 17 are bonded to the arrangement pattern 33 by solder or the like, the other end of the thermistor 20 is bonded to the gate control pattern 6, and the other end of the capacitor 17 is bonded to the source control pattern 7. The equivalent circuit illustrating the electrical configuration of the power semiconductor module 100E is the same as that of the power semiconductor module 100D according to the second embodiment illustrated in FIG. 13.

According to such a configuration, it is possible to prevent capacitor 17 from functioning at a low temperature and allow the capacitor 17 to function at a high temperature so as to suppress the gate oscillation as in the second embodiment. Accordingly, it is possible to prevent the switching speed of the semiconductor switching element 1 from increasing at a high temperature, which makes it possible to prevent the behavior of the power semiconductor module 100E from changing in accordance with the temperature.

Second Modification of Second Embodiment

In the second embodiment which is provided with a capacitor 17 and a thermistor 20, a wire may be further provided. Thereby, it is possible to easily adjust the performance of the filter formed from the capacitor 17 and easily disconnect the filter (the capacitor 17) from the circuit.

Figure 15:
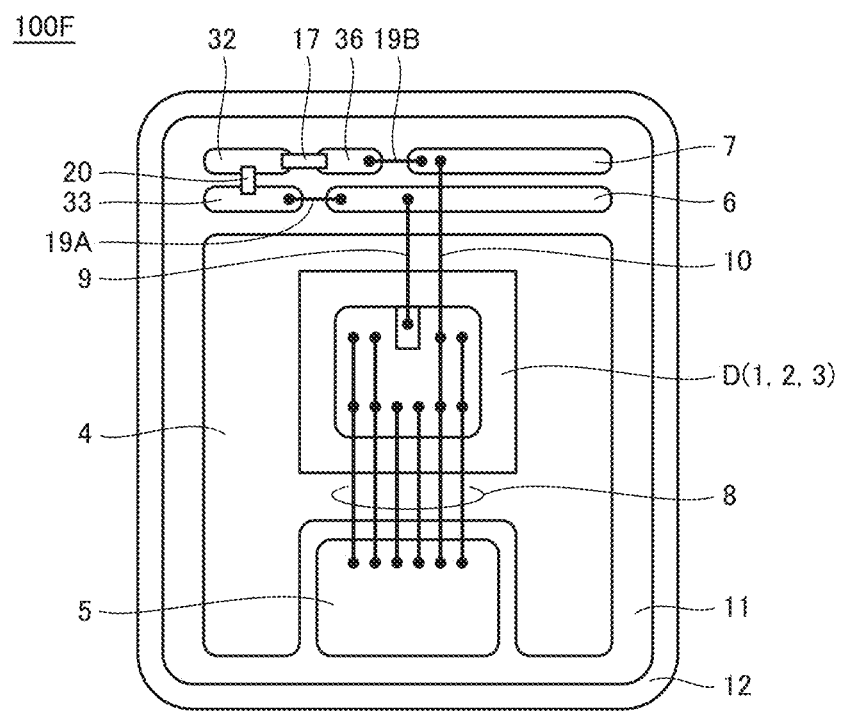
FIG. 15 is a plan view schematically illustrating the configuration of a power semiconductor module according to a second modification of the second embodiment.
Figure 16:
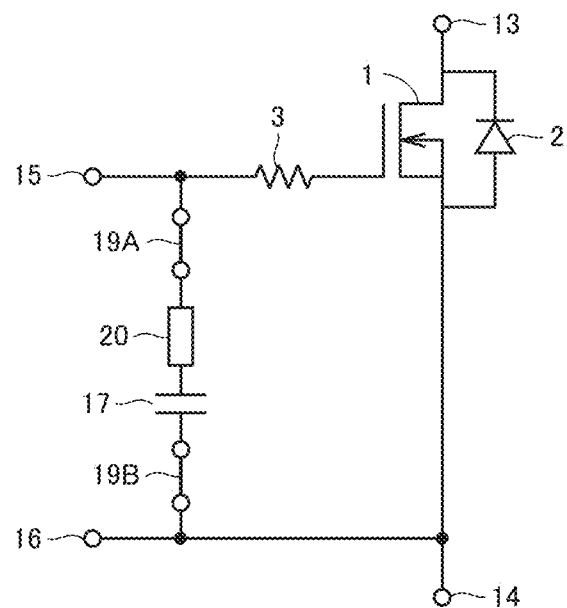
FIG. 16 is an equivalent circuit diagram illustrating an electrical configuration of the power semiconductor module illustrated in FIG. 15.

FIG. 15 is a plan view schematically illustrating the configuration of a power semiconductor module according to a second modification of the second embodiment, and FIG. 16 is an equivalent circuit diagram illustrating an electrical configuration of the power semiconductor module illustrated in FIG. 15.

With reference to FIGS. 15 and 16, the power semiconductor module 100F further includes arrangement patterns 33 and 36, and wires 19A and 19B in the power semiconductor module 100D according to the second embodiment illustrated in FIG. 12.

The arrangement pattern 36 is arranged between the arrangement pattern 32 and the source control pattern 7. The arrangement pattern 33 is the same as that described in the first modification and illustrated in FIG. 14. One end of the thermistor 20 and one end of the capacitor 17 are bonded to the arrangement pattern 32, the other end of the thermistor 20 is bonded to the arrangement pattern 33, and the other end of the capacitor 17 is bonded to the arrangement pattern 36. Further, the arrangement pattern 33 and the gate control pattern 6 are connected to each other by the wire 19A, and the arrangement pattern 36 and the source control pattern 7 are connected to each other by the wire 19B.

According to the second modification, in addition to the effect described in the second embodiment, it is possible to easily adjust the performance of the filter formed from the capacitor 17 simply by changing (adjusting) the length and/or the diameter of the wires 19A and 19B. When a filter is not required so as to prioritize the switching speed, the filter (the capacitor 17) may be easily disconnected from the circuit simply by not bonding at least one of the wires 19A and 19B. Further, since two wires 19A and 19B are used, it is possible to increase (enlarge) the adjustable range of the inductance of the filter formed from the capacitor 17.

Although two wires 19A and 19B are provided in the present modification as described above, only one of the wires 19A and 19B may be provided. In other words, the arrangement pattern 36 and the wire 19B may not be provided, and the other end of the capacitor 17 may be directly bonded to the source control pattern 7. Alternatively, the arrangement pattern 33 and the wire 19A may not be provided, and the other end of the thermistor 20 may be directly bonded to the gate control pattern 6.

Third Modification of Second Embodiment

In the second modification, it is described that the additional arrangement pattern 36 is arranged between the arrangement pattern 32 and the source control pattern 7, but the additional arrangement pattern may be arranged between the arrangement pattern 33 and the gate control pattern 6.

Figure 17:
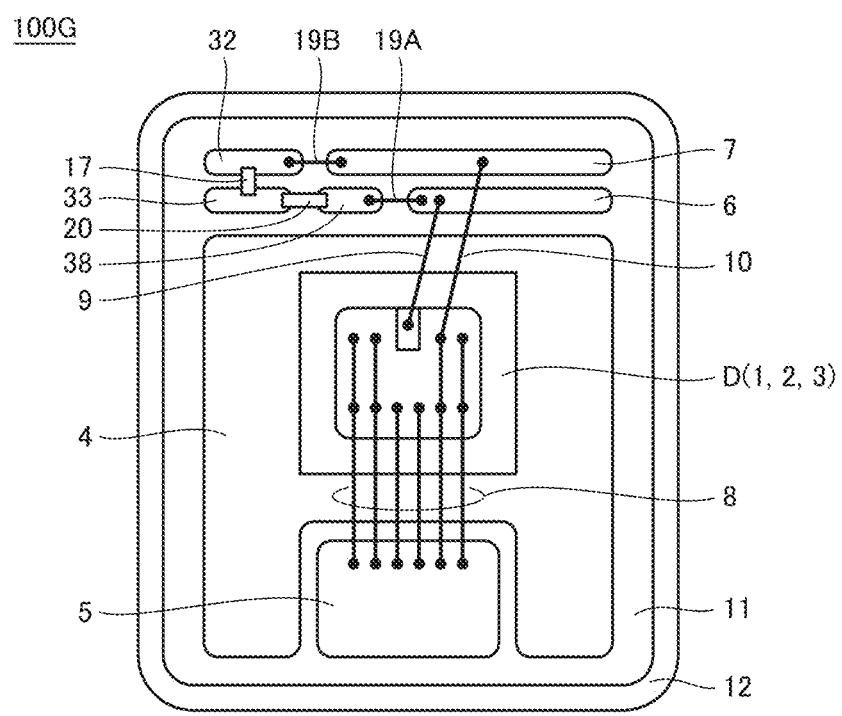
FIG. 17 is a plan view schematically illustrating the configuration of a power semiconductor module according to a third modification of the second embodiment.

FIG. 17 is a plan view schematically illustrating the configuration of a power semiconductor module according to a third modification of the second embodiment.

With reference to FIG. 17, the power semiconductor module 100G includes an arrangement pattern 38 instead of the arrangement pattern 36 in the power semiconductor module 100F according to the second modification illustrated in FIG. 15.

The arrangement pattern 38 is arranged between the arrangement pattern 33 and the gate control pattern 6. One end of the thermistor 20 and one end of the capacitor 17 are bonded to the arrangement pattern 33, the other end of the thermistor 20 is bonded to the arrangement pattern 38, and the other end of the capacitor 17 is bonded to the arrangement pattern 32. Further, the arrangement pattern 38 and the gate control pattern 6 are connected to each other by the wire 19A, and the arrangement pattern 32 and the source control pattern 7 are connected to each other by the wire 19B.

The equivalent circuit illustrating the electrical configuration of the power semiconductor module 100G is the same as that of the power semiconductor module 100F according to the second modification of the second embodiment illustrated in FIG. 16.

According to the third modification, the same effect as that of the second modification may be obtained.

Although in the above, it is described that two wires 19A and 19B are provided in the present modification, only one of the wires 19A and 19B may be provided. In other words, the arrangement pattern 32 and the wire 19B may not be provided, and the other end of the capacitor 17 may be directly bonded to the source control pattern 7. Alternatively, the arrangement pattern 38 and the wire 19A may not be provided, and the other end of the thermistor 20 may be directly bonded to the gate control pattern 6.

Fourth Modification of Second Embodiment

In the fourth modification, a capacitor 17 and a thermistor 20 are provided in a power semiconductor module including a plurality of semiconductor elements that operate in parallel.

Figure 18:
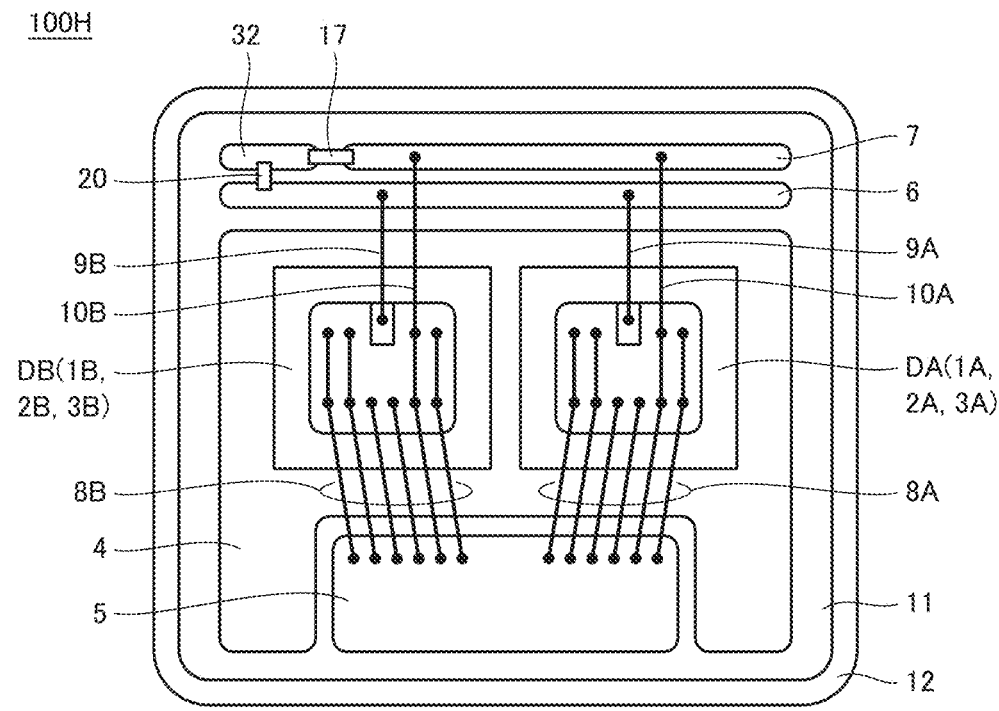
FIG. 18 is a plan view schematically illustrating the configuration of a power semiconductor module according to a fourth modification of the second embodiment.
Figure 19:
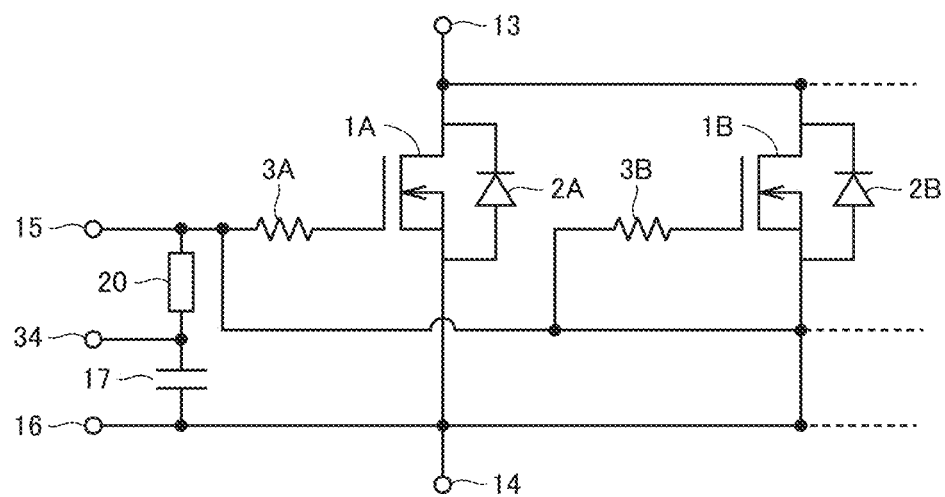
FIG. 19 is an equivalent circuit diagram illustrating an electrical configuration of the power semiconductor module illustrated in FIG. 18.

FIG. 18 is a plan view schematically illustrating the configuration of a power semiconductor module according to a fourth modification of the second embodiment, and FIG. 19 is an equivalent circuit diagram illustrating an electrical configuration of the power semiconductor module illustrated in FIG. 18.

With reference to FIGS. 18 and 19, the power semiconductor module 100H includes a plurality of semiconductor elements DA and DB instead of the semiconductor element D in the power semiconductor module 100D illustrated in FIG. 12. The semiconductor elements DA and DB are the same as those described with reference to FIG. 9.

According to the fourth modification, it is also possible for the power semiconductor module 100H including a plurality of semiconductor elements operating in parallel to obtain the same effect as that of the second embodiment.

Although in the above, it is described that the semiconductor elements DA and DB are provided instead of the semiconductor element D in the power semiconductor module 100D according to the second embodiment, but the semiconductor elements DA and DB may be provided instead of the semiconductor element D in the power semiconductor module 100E according to the first modification, the power semiconductor module 100F according to the second modification, or the power semiconductor module 100G according to the third modification.

In the second embodiment and the first to fourth modifications thereof, the semiconductor element D (or the semiconductor element DA or the semiconductor element DB) is made of a wide bandgap semiconductor (such as SiC-MOSFET). Since it is empirically known that gate oscillation is likely to occur in the wide bandgap semiconductor at a high temperature, an NTC thermistor having a small resistance value at a high temperature is used as the thermistor 20 so as to form a filter with the capacitor 17 at a high temperature.

Figure 20:
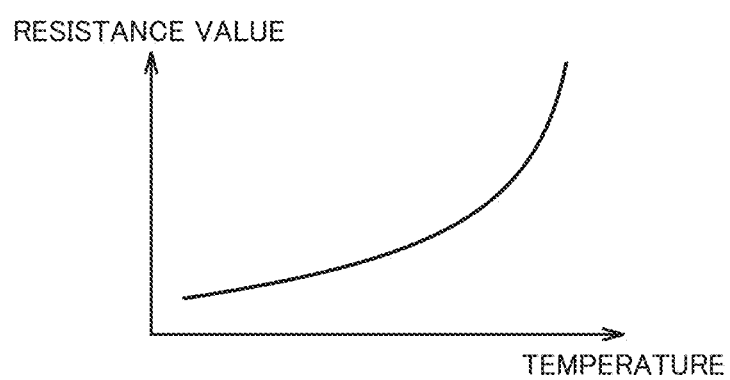
FIG. 20 is a graph illustrating the relationship between a resistance value and a temperature of a PTC thermistor.

On the other hand, when a semiconductor element is made of a conventional silicon semiconductor (such as Si-IGBT), gate oscillation may occur in the silicon semiconductor at a low temperature. Therefore, the gate oscillation is prominent at a low temperature than at a high temperature. When it is desired to suppress the gate oscillation generated at a low temperature, as illustrated in FIG. 20, a PTC (Positive Temperature Coefficient) thermistor having a small resistance at a low temperature and a large resistance at a high temperature may be used as the thermistor 20.

Third Embodiment

The third embodiment discloses a circuit for detecting the temperature of the thermistor 20 in the power semiconductor module according to the second embodiment and the modifications thereof in which the capacitor 17 and the thermistor 20 are provided.

Figure 21:
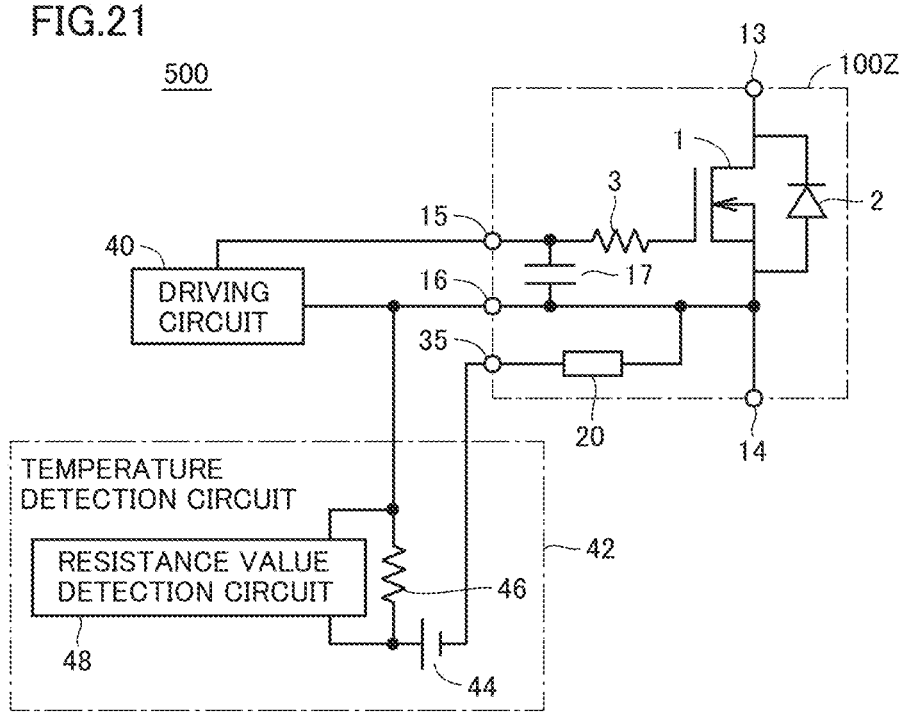
FIG. 21 is a circuit diagram illustrating an electrical configuration of a power semiconductor device according to a comparative example.

FIG. 21 is a circuit diagram illustrating an electrical configuration of a power semiconductor element according to a comparative example. FIG. 21 illustrates a conventional temperature detection circuit as a comparative example of the temperature detection circuit for detecting the temperature of the thermistor 20.

With reference to FIG. 21, the power semiconductor device 500 includes a power semiconductor module 100Z, a driving circuit 40, and a temperature detection circuit 42. The power semiconductor module 100Z includes a semiconductor switching element 1, a diode 2, a gate resistor 3, a capacitor 17, and a thermistor 20.

The capacitor 17 is electrically connected between the gate electrode and the source electrode of the semiconductor switching element 1. The driving circuit 40 is connected to a gate terminal 15 and a source control terminal 16 of the power semiconductor module 100Z. The gate terminal 15 is electrically connected to a gate control pattern (not shown) of the power semiconductor module 100Z, and the source control terminal 16 is electrically connected to a source control pattern (not shown) of the power semiconductor module 100Z. The driving circuit 40 generates a gate voltage for driving the semiconductor switching element 1.

One end of the thermistor 20 is connected to the source electrode of the semiconductor switching element 1 and the other end thereof is connected to the thermistor detection terminal 35. The temperature detection circuit 42 is connected to the source control terminal 16 and the thermistor detection terminal 35.

The temperature detection circuit 42 includes a voltage source 44, a resistance element 46, and a resistance value detection circuit 48. The voltage source 44 supplies a constant voltage. The resistance value detection circuit 48 calculates the resistance value of the thermistor 20 by detecting a voltage of the resistance element 46. Specifically, since the voltage of the resistance element 46 changes in response to the resistance value of the thermistor 20, if the relationship between the voltage of the resistance element 46 and the resistance value of the thermistor 20 is determined in advance, the resistance value of the thermistor 20 may be determined from the detection voltage of the resistance value detection circuit 48. Then, the resistance value of the thermistor 20 may be converted into a temperature by using the relationship illustrated in FIG. 11.

However, the temperature detection circuit 42 requires a dedicated voltage source 44 to detect the resistance value of the thermistor 20. Therefore, the third embodiment discloses a temperature detection circuit that does not use such a voltage source.

Figure 22:
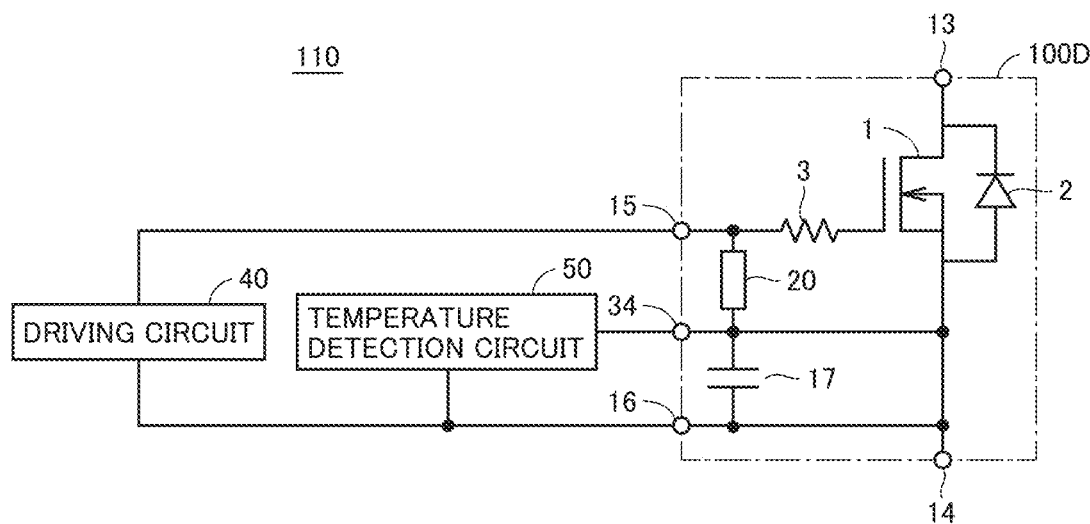
FIG. 22 is a circuit diagram illustrating an electrical configuration of a power semiconductor device according to a third embodiment.

FIG. 22 is a circuit diagram illustrating an electrical configuration of a power semiconductor device according to a third embodiment. With reference to FIG. 22, the power semiconductor device 110 includes a power semiconductor module 100D (see FIGS. 12 and 13), a driving circuit 40, and a temperature detection circuit 50.

The power semiconductor module 100D is the same as that described in the second embodiment (see FIGS. 12 and 13). The driving circuit 40 is the same as that described with reference to FIG. 21.

A temperature detection circuit 50 is connected to a detection terminal 34 and a source control terminal 16 of the power semiconductor module 100D. The detection terminal 34 is connected to a connection node between the thermistor 20 and the capacitor 17. Specifically, the detection terminal 34 is electrically connected to the arrangement pattern 32 illustrated in FIG. 12. The source control terminal 16 is electrically connected to the source control pattern 7 illustrated in FIG. 12. The temperature detection circuit 50 detects an inter-terminal voltage of the capacitor 17, and detects a temperature of the thermistor 20 based on a change in the detected voltage. Hereinafter, a method of detecting the temperature of the thermistor 20 by the temperature detection circuit 50 will be described in detail.

Figure 23:
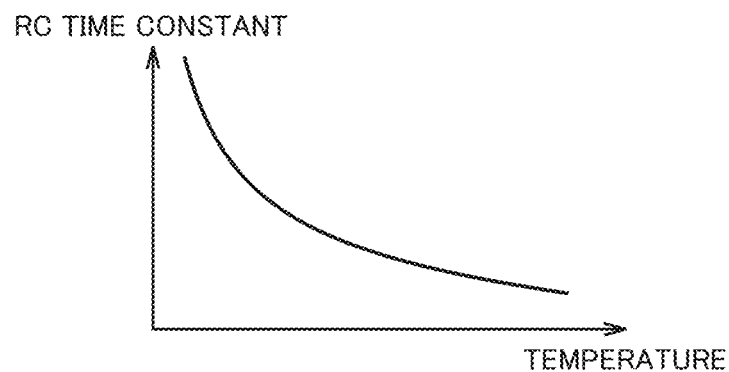
FIG. 23 is a graph illustrating the relationship between a time constant and a temperature of a RC circuit composed of a thermistor and a capacitor illustrated in FIG. 22.

FIG. 23 is a diagram illustrating the relationship between a time constant and a temperature of a RC circuit composed of the thermistor 20 and the capacitor 17 illustrated in FIG. 22. With reference to FIG. 23, as the temperature increases, the time constant of the RC circuit composed of the thermistor 20 and the capacitor 17 decreases, and as the temperature decreases, the time constant of the RC circuit increases.

Figure 24:
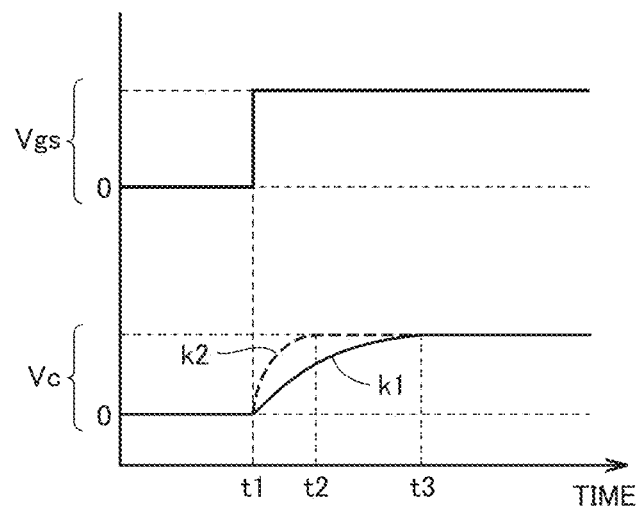
FIG. 24 is a waveform diagram illustrating a change in an inter-terminal voltage of a capacitor in response to a change in a gate-source voltage.

FIG. 24 is a waveform diagram illustrating a change in an inter-terminal voltage Vc of the capacitor 17 in response to a change in a gate-source voltage Vgs. With reference to FIG. 24, the gate-source voltage Vgs (hereinafter will be simply referred to as the "gate voltage Vgs") is simply illustrated as a rectangular wave, and the gate voltage Vgs rises at timing t1.

In the inter-terminal voltage Vc (hereinafter will be simply referred to as the "voltage Vc") of the capacitor 17, a solid line k1 indicates a change in the voltage Vc at a relatively low temperature, and a dotted line k2 indicates a change in the voltage Vc at a relatively high temperature. As illustrated in FIG. 23, as the temperature decreases, the time constant of the RC circuit increases, and thereby, the voltage Vc should reach a predetermined voltage at timing t3. However, as the temperature increases, the time constant of the RC circuit decreases, and thereby, the voltage Vc reaches the predetermined voltage at timing t2 earlier than timing t3.

Accordingly, if the relationship between the temperature and the time from a timing when the gate voltage Vgs changes to a timing when the voltage Vc reaches the predetermined voltage is determined in advance, the temperature detection circuit 50 may detect the temperature of the thermistor 20 by detecting an interval from timing t1 when the gate voltage Vgs changes to a timing when the voltage Vc reaches the predetermined voltage on the basis of the relationship.

According to the third embodiment, it is possible to detect the temperature of the thermistor 20 without using a dedicated voltage source 44 as illustrated in FIG. 21.

Although in the above, it is described that the temperature detection circuit 50 is connected to the detection terminal 34 and the source control terminal 16 of the power semiconductor module 100D, the temperature detection circuit 50 may be connected to the source terminal 14 instead of the source control terminal 16. Even with such a configuration, the temperature of the thermistor 20 may be detected by using the temperature detection circuit 50.

Although in the above, it is described that the driving circuit 40 and the temperature detection circuit 50 are provided as being separate from the power semiconductor module 100D, the driving circuit 40 and/or the temperature detection circuit 50 may be built in the power semiconductor module 100D.

Further, in the above, it is described that the power semiconductor device 110 includes the power semiconductor module 100 D according to the second embodiment, it may include any of the power semiconductor module 100E according to the first modification, the power semiconductor module 100F according to the second modification, the power semiconductor module 100G according to the third modification, and the power semiconductor module 100E according to the fourth 100H of the second embodiment instead of the power semiconductor module 100D.

Modification of Third Embodiment

In the third embodiment, it is described that the temperature detection circuit 50 detects the temperature of the thermistor 20 by detecting the voltage Vc of the capacitor 17, the temperature detection circuit 50 may be configured to detect the temperature of the thermistor 20 by detecting the voltage of the thermistor 20.

Figure 25:
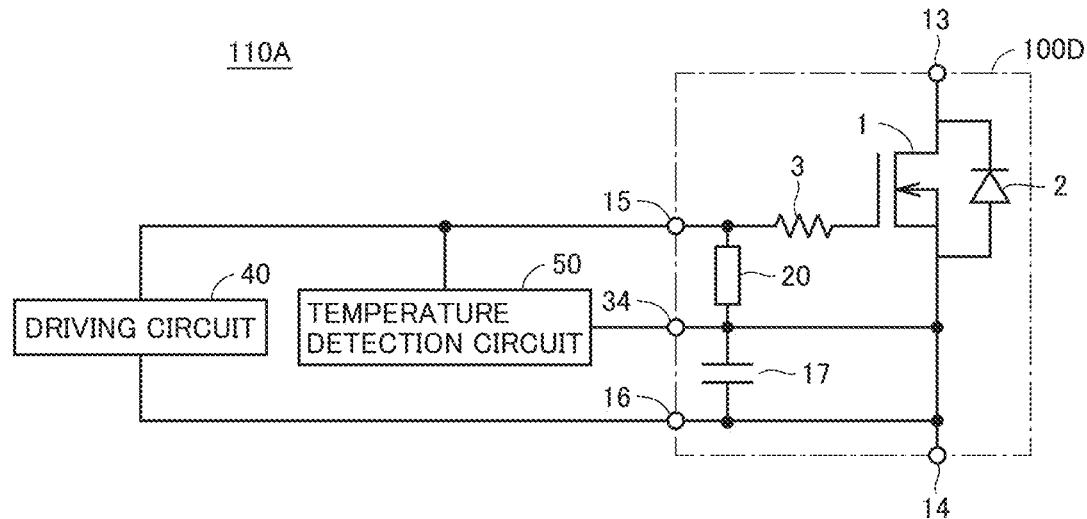
FIG. 25 is a circuit diagram illustrating an electrical configuration of a power semiconductor device according to a modification of the third embodiment.

FIG. 25 is a circuit diagram illustrating an electrical configuration of a power semiconductor element according to a modification of the third embodiment. With reference to FIG. 25, the power semiconductor device 110A is different from the power semiconductor device 110 according to the third embodiment illustrated in FIG. 22 in that the temperature detection circuit 50 is connected to the gate terminal 15 and the detection terminal 34 of the power semiconductor module 100D.

The temperature detection circuit 50 detects an inter-terminal voltage of the thermistor 20, and detects a temperature of the thermistor 20 based on a change in the detected voltage. Hereinafter, a method of detecting the temperature of the thermistor 20 by the temperature detection circuit 50 according to the present modification will be described.

Figure 26:
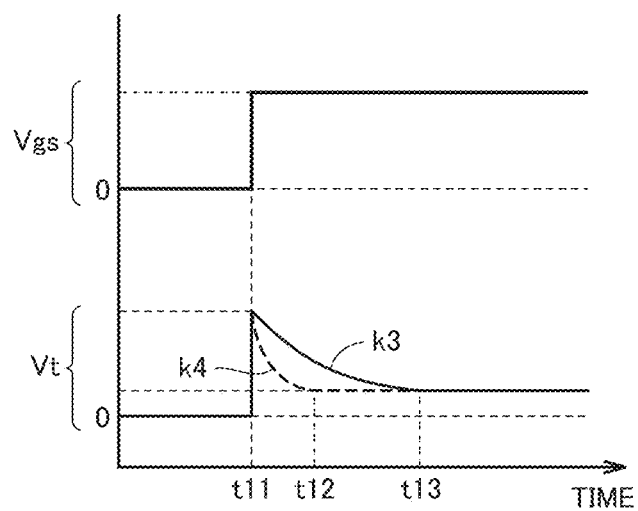
FIG. 26 is a waveform diagram illustrating a change in an inter-terminal voltage of a thermistor in response to a change in a gate-source voltage.

FIG. 26 is a waveform diagram illustrating a change in an inter-terminal voltage Vt of the thermistor 20 in response to a change in the gate-source voltage Vgs. With reference to FIG. 26, the gate voltage Vgs is simply illustrated as a rectangular wave, and the gate voltage Vgs rises at timing t11.

In the inter-terminal voltage Vt (hereinafter will be simply referred to as the "voltage Vt") of the thermistor 20, a solid line k3 indicates a change in the voltage Vt at a relatively low temperature, and a dotted line k4 indicates a change in the voltage Vt at a relatively high temperature. As illustrated in FIG. 23, as the temperature decreases, the time constant of the RC circuit increases, and thereby, the voltage Vc should reach a predetermined voltage at timing t13. However, as the temperature increases, the time constant of the RC circuit decreases, and thereby, the voltage Vc reaches the predetermined voltage at timing t12 earlier than timing t13.

Accordingly, if the relationship between the temperature and the time from a timing when the gate voltage Vgs changes to a timing when the voltage Vt reaches the predetermined voltage is determined in advance, the temperature detection circuit 50 may detect the temperature of the thermistor 20 by detecting an interval from timing t11 when the gate voltage Vgs changes to a timing when the voltage Vt reaches the predetermined voltage on the basis of the relationship.

According to the modification of the third embodiment, it is also possible to detect the temperature of the thermistor 20 without using a dedicated voltage source 44 as illustrated in FIG. 21.

Also in the present modification, it is described that the power semiconductor device 110A includes the power semiconductor module 100D according to the second embodiment, it may include any of the power semiconductor module 100E according to the first modification, the power semiconductor module 100F according to the second modification, the power semiconductor module 100G according to the third modification, and the power semiconductor module 100E according to the fourth 100H of the second embodiment instead of the power semiconductor module 100D.

Fourth Embodiment

As described above, although it is empirically known that gate oscillation tends to occur in a semiconductor element at a high temperature, and actually, the gate oscillation does not always occur at a high temperature, it tends to occur at the time of switching the semiconductor switching element 1. Therefore, the gate oscillation may occur at the time of switching the semiconductor switching element 1 even at a low temperature. On the other hand, as described above, a filter which is formed from the capacitor 17 for suppressing gate oscillation may disadvantageously decrease the switching speed, and it is not desirable for the filter to operate constantly.

Thus, the fourth embodiment discloses a filter capable of functioning only at a timing of switching the semiconductor switching element 1 where gate oscillation is likely to occur.

Figure 27:
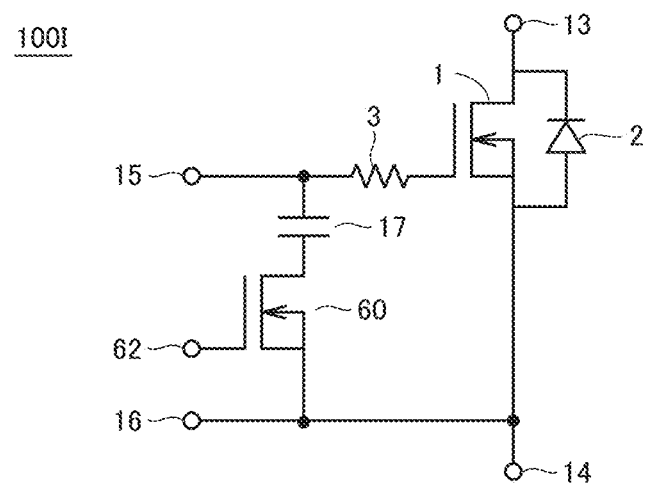
FIG. 27 is an equivalent circuit diagram illustrating an electrical configuration of a power semiconductor module according to a fourth embodiment.

FIG. 27 is an equivalent circuit diagram illustrating an electrical configuration of a power semiconductor module according to a fourth embodiment. With reference to FIG. 27, the power semiconductor module 100I includes a semiconductor switching element 1, a diode 2, a gate resistor 3, a capacitor 17, and a filter-forming switching element 60.

The filter-forming switching element 60 (hereinafter may be simply referred to as the "switching element 60") is connected in series to the capacitor 17, and the capacitor 17 and the switching element 60 connected in series are electrically connected between the gate electrode and the source electrode of the semiconductor switching element 1. The switching element 60 is driven by a driving circuit (not shown) connected to an external terminal 62.

When the switching element 60 is turned off, since the switching element 60 has a high resistance, the filter formed from the capacitor 17 does not function. On the other hand, when the switching element 60 is turned on, since the resistance value of the switching element 60 decreases, the filter formed from the capacitor 17 functions.

Figure 28:
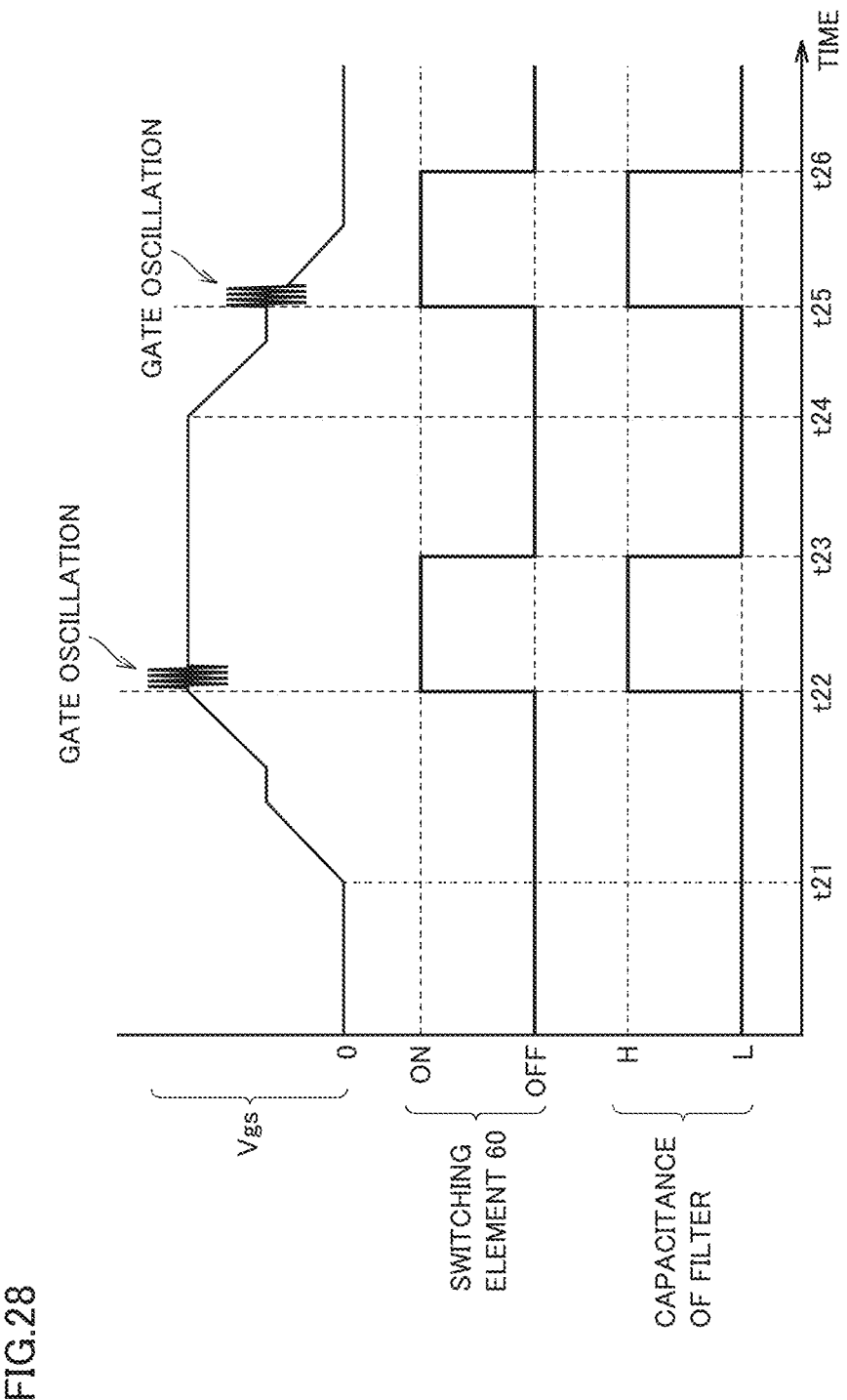
FIG. 28 is a waveform diagram illustrating the relationship between a gate voltage and an operation of a filter-forming switching element.

FIG. 28 is waveform diagram illustrating the relationship between the gate voltage Vgs and operations of the filter-forming switching element 60. With reference to FIG. 28, in the present embodiment, the gate voltage Vgs begins to rise at timing t21, and the gate oscillation occurs immediately after timing t22 at which the rise of the gate voltage Vgs ends. At timing t24, the gate voltage Vgs begins to decrease, and the gate oscillation also occurs immediately after timing t25 at which a mirror period ends.

Therefore, in the present embodiment, the switching element 60 is turned on during a period (a first period) from timing t22 to timing t23 during which the semiconductor switching element 1 is turned on and the gate oscillation is likely to occur, and during a period (a second period) from timing t25 to timing t26 during which the semiconductor switching element 1 is turned off and the gate oscillation is likely to occur, and the switching element 60 is turned off during the other periods.

As a result, the capacitance of the filter formed from the capacitor 17 becomes great only during the period from the timing t22 to the timing t23 and the period from the timing t25 to the timing t26 during which the gate oscillation is likely to occur, the filter functions. On the other hand, during the other periods, the switching element 60 is turned off, the capacitance of the filter becomes small, and thereby, the filter does not function.

Thus, it is possible to effectively suppress the gate oscillation by adjusting the ON period of the filter-forming switching element 60 in response to the timing at which the gate oscillation occurs. The timing at which the gate oscillation occurs may be determined in advance by an evaluation experiment or the like.

Figure 29:
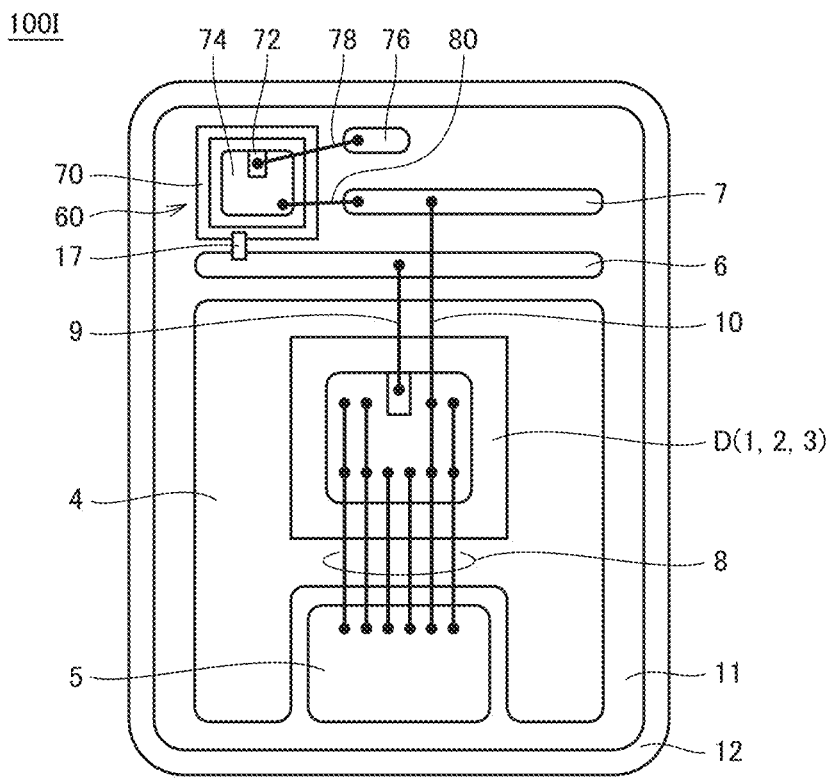
FIG. 29 is a plan view schematically illustrating the configuration of a power semiconductor module according to a fourth embodiment.

FIG. 29 is a plan view schematically illustrating the configuration of a power semiconductor module according to the fourth embodiment. With reference to FIG. 29, the power semiconductor module 100I includes a semiconductor element D, a drain pattern 4, a source pattern 5, a gate control pattern 6, a source control pattern 7, a source wire 8, a gate wire 9, a source control wire 10, an insulating substrate 11, and a base plate 12. The power semiconductor module 100I further includes a capacitor 17, a switching element 60, a drain pattern 70, a gate control pattern 76, and wires 78 and 80.

One end of the capacitor 17 is bonded to the drain pattern 70 by solder or the like, and the other end of the capacitor 17 is bonded to the gate control pattern 6. A drain pad (not shown) of the switching element 60 is bonded to the drain pattern 70 by solder or the like.

A gate pad 72 of the switching element 60 is connected to the gate control pattern 76 by the wire 78, and a source pad 74 of the switching element 60 is connected to the source control pattern 7 by the wire 80.

The other components are the same as those of the power semiconductor module 100 illustrated in FIG. 1. With such a configuration, the electric circuit illustrated in FIG. 27 is implemented.

As described above, according to the fourth embodiment, it is possible to adjust the ON period of the filter-forming switching element 60 in response to the timing at which gate oscillation occurs, which makes it possible to effectively suppress the gate oscillation.

Fifth Embodiment

The fifth embodiment relates to a power converter to which the power semiconductor module according to each of the embodiments described above and the modifications thereof is applied. The present invention is not particularly limited to a specific power converter, and in the fifth embodiment, the power converter will be described as a three-phase inverter to which the present invention is applied.

Figure 30:
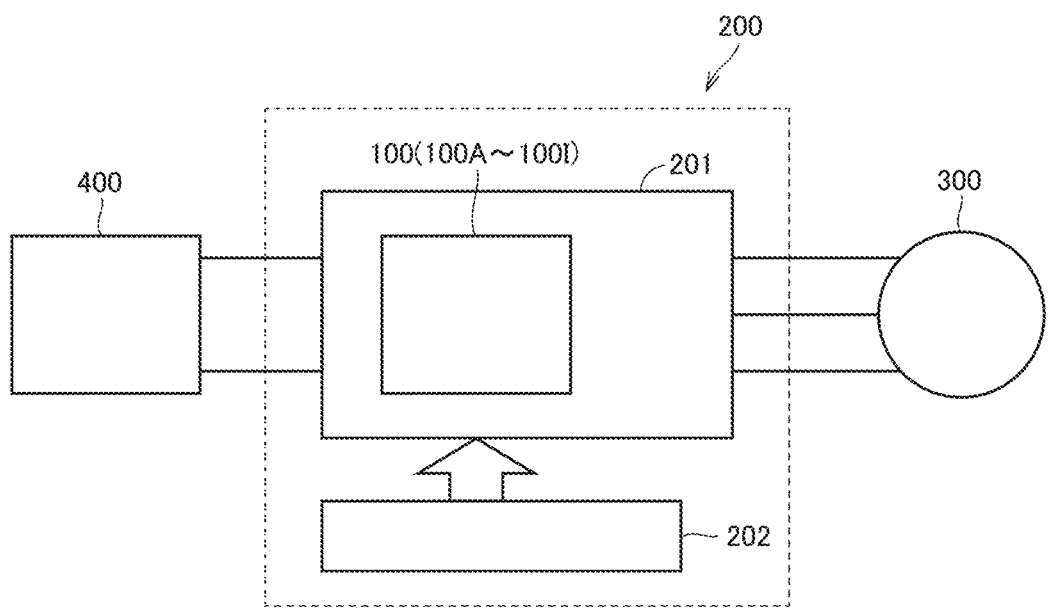
FIG. 30 is a block diagram illustrating the configuration of a power conversion system to which a power converter according to a fifth embodiment is applied.

FIG. 30 is a block diagram illustrating the configuration of a power conversion system to which a power converter according to the fifth embodiment is applied.

With reference to FIG. 30, the power conversion system includes a power converter 200, a load 300, and a power supply 400. The power supply 400 is a DC power supply, and is configured to supply DC power to the power converter 200. The power supply 400 may be any power supply. For example, the power supply 400 may be a DC system, a solar cell or a storage battery, or may be a rectifier circuit or an AC/DC converter connected to an AC system. The power supply 100 may be a DC/DC converter configured to convert DC power output from a DC system into another DC power.

The power converter 200 is a three-phase inverter connected between the power supply 400 and the load 300, and is configured to convert DC power supplied from the power supply 400 into AC power and supply the AC power to the load 300. The power converter 200 includes a main conversion circuit 201 configured to convert DC power into AC power and output the AC power, and a control circuit 202 configured to output a control signal for controlling the main conversion circuit 201 to the main conversion circuit 201.

The load 300 is a three-phase electric motor driven by the AC power supplied from the power converter 200. The load 300 is not particularly limited, it may be an electric motor mounted on various electric apparatuses such as an electric motor for a hybrid vehicle, an electric vehicle, a railroad vehicle, an elevator, or an air conditioner.

Hereinafter, the power converter 200 will be described in detail. The main conversion circuit 201 includes switching elements (not shown) and freewheel diodes (not shown).

When the switching element is switched, the main conversion circuit 201 converts DC power supplied from the power supply 100 into AC power and supplies the AC power to the load 300. The main conversion circuit 201 may have various circuit configurations. The main conversion circuit 201 according to the fifth embodiment is a two-level three-phase full bridge circuit, and may include six switching elements and six freewheel diodes connected in anti-parallel to the switching elements, respectively. Each switching element and each diode provided in the main conversion circuit 201 may be configured to include a power semiconductor module 100 (100A to 100I) according to any one of the embodiments mentioned above and modifications thereof. Among the six switching elements, every two switching elements are connected in series so as to form upper and lower arms, and each of the upper and lower arms forms each phase (U phase, V phase and W phase) of the full bridge circuit. The output terminals of the upper and lower arms, in other words, the three output terminals of the main conversion circuit 201 are connected to the load 300.

The main conversion circuit 201 includes a driving circuit (not shown) for driving each switching element. As described in the third embodiment, the driving circuit may be provided separately from the power semiconductor module 100 (100A to 100I) or may be built in the power semiconductor module 100 (100A to 100I). The driving circuit generates a driving signal for driving the switching elements provided in the main conversion circuit 201, and supplies the driving signal to control electrodes of the switching elements included in the main conversion circuit 201. Specifically, the driving circuit, in accordance with a control signal from the control circuit 203, outputs a driving signal for turning on the switching element and a driving signal for turning off the switching element to the control electrode of each switching element. In the case of maintaining the switching element in the ON state, the driving signal is a voltage signal (ON signal) equal to or higher than the threshold voltage of the switching element, and in the case of maintaining the switching element in the OFF state, the driving signal is a voltage signal (OFF signal) equal to or lower than the threshold voltage of the switching element.

The control circuit 202 controls the switching elements of the main conversion circuit 201 so as to supply a desired power to the load 300. Specifically, the control circuit 202 calculates a time (On time) to turn on each switching element of the main conversion circuit 201 based on a power to be supplied to the load 300. For example, the main conversion circuit 201 may be controlled by a pulse width modulation (PWM) control which modulates the ON time of the switching element based on a voltage to be output. Then, the control circuit 202 outputs a control command (control signal) to the driving circuit included in the main conversion circuit 201 so that an ON signal is output to the switching element which should be turned on at each time or an OFF signal is output to each switching element which should be turned off at each time. The driving circuit outputs an ON signal or an OFF signal to the control electrode of each switching element as the driving signal in accordance with the control signal.

In the power converter according to the fifth embodiment, since the power semiconductor module 100 (100A to 100I) according to each of the embodiments mentioned above and the modifications thereof is applied to the switching elements and diodes of the main conversion circuit 201, the same effect as that of the power semiconductor modules 100 (100A to 100I) may be achieved.

In the present embodiment, as an example, it is described that the present invention is applied to a two-level three-phase inverter, but the present invention is not limited thereto, the present invention may be applied to various power converters. Although the power converter according to the present embodiment is a two-level power converter, the power converter according to the present embodiment may be a three-level power converter or a multi-level power converter. When the power converter supplies power to a single-phase load, the present invention may be applied to a single-phase inverter. When the power converter is configured to supply power to a DC load or the like, the present invention may be applied to a DC/DC converter or an AC/DC converter.

The power converter to which the present invention is applied is not limited to the case where the load is an electric motor, and it may be used as, for example, a power supply for an electric discharge machine or a laser machine, or a power supply for an induction cooker or a non-contact power supply system. The power converter to which the present invention is applied may be used as a power conditioner for a solar power generation system, a power storage system, or the like.

In each of the embodiments mentioned above and the modifications thereof, it is described that the semiconductor element D (DA, DB) is made of a wide bandgap semiconductor, the present invention is not limited to a power semiconductor module and a power converter in which the semiconductor element is made of a wide bandgap semiconductor, it may include a power semiconductor module and a power converter made of conventional silicon-based semiconductor elements.

The embodiments disclosed herein are intended to be carried out in any appropriate combination unless they are technically inconsistent to each other. The embodiments disclosed herein are merely by way of example and not limited thereto. The scope of the present invention is defined by the terms of the claims, rather than the description above, and is intended to include any modifications within the meaning and scope equivalent to the terms of the claims.

REFERENCE SIGNS LIST 1, 1A, 1B: semiconductor switching elements; 2, 2A, 2B: diode; 3, 3A, 3B: gate resistor; 4, 70: drain pattern; 5: source pattern; 6, 76: gate control pattern; 7: source control pattern; 8, 8A, 8B: source wire; 9, 9A, 9B: gate wire; 10, 10A, 10B: source control wire; 11: insulating substrate; 12: base plate; 13: drain terminal; 14: source terminal; 15: gate terminal; 16: source control terminal; 17: capacitor; 18, 31: capacitor arrangement pattern; 19, 19A, 19B, 78, 80: wire; 20: thermistor; 23, 25: solder; 24: back surface pattern; 26: insulating film; 27, 74: source pad; 28, 72: gate pad; 32, 33, 36, 38: arrangement pattern; 34: detection terminal; 35: thermistor detection terminal; 40: driving circuit; 42, 50: temperature detection circuit; 44: voltage source; 46: resistance element; 48: resistance value detection circuit; 60: filter-forming switching element; 62: external terminal; 100, 100A to 100I, 100Z: power semiconductor module; 110, 110A, 500: power semiconductor device; 200: power converter; 201: main conversion circuit; 202: control circuit; 300: load; 400: power supply

The invention claimed is:

1. A power semiconductor module comprising:
a first semiconductor switching element;
a gate control pattern to which a gate electrode of the first semiconductor switching element is connected;

a source control pattern to which a source electrode of the first semiconductor switching element is connected;

a filter forming element to form a low pass filter; and a first filter arrangement pattern to which one end of the filter forming element is connected, and the other end of the filter forming element being connected to one pattern of the gate control pattern and the source control pattern.

2. The power semiconductor module according to claim 1, further comprising at least one second semiconductor switching element connected in parallel to the first semiconductor switching element, wherein a gate electrode of the second semiconductor switching element is connected to the gate control pattern, and a source electrode of the second semiconductor switching element is connected to the source control pattern.

3. The power semiconductor module according to claim 1, further comprising a thermistor connected in series to the filter forming element between the gate control pattern and the source control pattern.

4. The power semiconductor module according to claim 3, further comprising a temperature detection device which is connected between terminals of the filter forming element to detect a temperature of the thermistor based on a change in a voltage between the terminals of the filter forming element.

5. The power semiconductor module according to claim 3, further comprising a temperature detection device which is connected between terminals of the thermistor to detect a temperature of the thermistor based on a change in a voltage between the terminals of the thermistor.

6. The power semiconductor module according to claim 3, wherein the thermistor is an NTC thermistor.

7. The power semiconductor module according to claim 1, wherein the filter forming element is a capacitor.

8. The power semiconductor module according to claim 1, wherein the first semiconductor switching element is formed of a wide bandgap semiconductor.

9. The power semiconductor module according to claim 8, wherein the wide bandgap semiconductor is any one of silicon carbide, gallium nitride and diamond.

10. A power converter comprising:

a main conversion circuit including the power semiconductor module according to claim 1; and a control circuit to generate a control signal for controlling the main conversion circuit and output the control signal to the main conversion circuit.

11. The power semiconductor module according to claim 1, further comprising a first wire to electrically connect the first filter arrangement pattern and the other pattern of the gate control pattern and the source control pattern.

12. The power semiconductor module according to claim 11, wherein the one pattern of the gate control pattern and the source control pattern includes a pattern to which the gate electrode or the source electrode is connected, and a second filter arrangement pattern to which the other end of the filter forming element is connected, the power semiconductor module further includes a second wire electrically connecting the second filter arrangement pattern and the pattern.

13. A power semiconductor module comprising:

a first semiconductor switching element;

a gate control pattern to which a gate electrode of the first semiconductor switching element is connected;

a source control pattern to which a source electrode of the first semiconductor switching element is connected;

a filter forming element to form a low pass filter;

a thermistor connected in series to the filter forming element; and an arrangement pattern to which one end of the filter forming element and one end of the thermistor are connected;

the other end of the filter forming element being connected to one pattern of the gate control pattern and the source control pattern, and the other end of the thermistor being connected to the other pattern of the gate control pattern and the source control pattern.

14. The power semiconductor module according to claim 13, further comprising at least one second semiconductor switching element connected in parallel to the first semiconductor switching element, wherein a gate electrode of the second semiconductor switching element is connected to the gate control pattern, and a source electrode of the second semiconductor switching element is connected to the source control pattern.

15. The power semiconductor module according to claim 13, further comprising a temperature detection device which is connected between terminals of the filter forming element to detect a temperature of the thermistor based on a change in a voltage between the terminals of the filter forming element.

16. The power semiconductor module according to claim 13, further comprising a temperature detection device which is connected between terminals of the thermistor to detect a temperature of the thermistor based on a change in a voltage between the terminals of the thermistor.

17. The power semiconductor module according to claim 13, wherein the thermistor is an NTC thermistor.

18. A power semiconductor module comprising:

a first semiconductor switching element;

a gate control pattern to which a gate electrode of the first semiconductor switching element is connected;

a source control pattern to which a source electrode of the first semiconductor switching element is connected;

a filter forming element to form a low pass filter; and a second semiconductor switching element connected in series to the filter forming element, the second semiconductor switching element being configured to be turned on only during a first period when the first semiconductor switching element is turned on.

19. The power semiconductor module according to claim 18, wherein the second semiconductor switching element is further configured to be turned on only during a second period when the first semiconductor switching element is turned off.

* * * * *